(12) United States Patent
Zhou et al.

(10) Patent No.: US 12,414,328 B2
(45) Date of Patent: Sep. 9, 2025

(54) CO-INTEGRATING GATE-ALL-AROUND NANOSHEET TRANSISTORS AND COMB-NANOSHEET TRANSISTORS

(71) Applicant: International Business Machines Corporation, Armonk, NY (US)

(72) Inventors: Huimei Zhou, Albany, NY (US);
Julien Frougier, Albany, NY (US);
Nicolas Loubet, Guilderland, NY (US);
Ruilong Xie, Niskayuna, NY (US);
Miaomiao Wang, Albany, NY (US);
Veeraraghavan S. Basker,
Schenectady, NY (US)

(73) Assignee: International Business Machines Corporation, Armonk, NY (US)

(*) Notice: Subject to any disclaimer, the term of this patent is extended or adjusted under 35 U.S.C. 154(b) by 757 days.

(21) Appl. No.: 17/548,751

(22) Filed: Dec. 13, 2021

(65) Prior Publication Data
US 2023/0187514 A1     Jun. 15, 2023

(51) Int. Cl.
*H10D 30/67* (2025.01)
*H10D 62/10* (2025.01)
(Continued)

(52) U.S. Cl.
CPC ..... *H10D 30/6735* (2025.01); *H10D 30/6713* (2025.01); *H10D 30/6757* (2025.01);
(Continued)

(58) Field of Classification Search
CPC .......... H10D 30/6735; H10D 30/6713; H10D 30/6757; H10D 62/115; H10D 62/118;
(Continued)

(56) References Cited

U.S. PATENT DOCUMENTS 9,614,056 B2    4/2017  Xie et al.
10,103,238 B1   10/2018 Zang et al.
(Continued)

OTHER PUBLICATIONS

International Search Report; International Application No. PCT/EP2022/084233; International Filing Date: Dec. 2, 2022; Date of mailing: May 4, 2023; 16 pages.
(Continued)

*Primary Examiner* — Eva Y Montalvo
*Assistant Examiner* — Pratiksha Jayant Lohakare
(74) *Attorney, Agent, or Firm* — CANTOR COLBURN LLP; L. Jeffrey Kelly

(57) ABSTRACT

Embodiments of the present invention are directed to processing methods and resulting structures for co-integrating gate-all-around (GAA) nanosheets and comb-nanosheets on the same chip, wafer, or substrate. In a non-limiting embodiment of the invention, a GAA nanosheet device is formed in a first region of a substrate. The GAA nanosheet device includes a first nanosheet stack, a second nanosheet stack, and a first fin spacing distance between the first nanosheet stack and the second nanosheet stack. A comb-nanosheet device is formed in a second region of a substrate. The comb-nanosheet device includes a third nanosheet stack, a fourth nanosheet stack, and a second fin spacing distance between the third nanosheet stack and the fourth nanosheet stack that is less than the first fin spacing distance.

7 Claims, 11 Drawing Sheets

(51) Int. Cl.
H10D 84/01 (2025.01)
H10D 84/03 (2025.01)

(52) U.S. Cl.
CPC ......... H10D 62/115 (2025.01); H10D 62/118 (2025.01); H10D 84/0128 (2025.01); H10D 84/013 (2025.01); H10D 84/0151 (2025.01); H10D 84/038 (2025.01)

(58) Field of Classification Search
CPC ............. H10D 84/0128; H10D 84/013; H10D 84/0151; H10D 84/038; H10D 30/797; H10D 30/014; H10D 30/43; H10D 64/017; H10D 62/822; H10D 62/121; H10D 84/83; B82Y 10/00
USPC ......................................................... 257/288
See application file for complete search history.

(56) References Cited

U.S. PATENT DOCUMENTS

| | | | |
|---|---|---|---|
| 10,510,620 | B1 | 12/2019 | Chanemougame et al. |
| 11,081,559 | B1* | 8/2021 | Liang .................... H10D 64/01 |
| 2018/0374761 | A1* | 12/2018 | Guillorn ................ H10D 64/01 |
| 2019/0341498 | A1* | 11/2019 | Leobandung ........ H10D 84/038 |
| 2020/0035567 | A1* | 1/2020 | Chanemougame .......................... H10D 84/0193 |
| 2020/0105869 | A1 | 4/2020 | Loubet et al. |
| 2020/0341498 | A1* | 10/2020 | Birchfield ............... E03C 1/055 |
| 2020/0343361 | A1 | 10/2020 | Cheng et al. |
| 2021/0118747 | A1 | 4/2021 | Litta et al. |
| 2021/0183711 | A1 | 6/2021 | Litta et al. |
| 2021/0193821 | A1 | 6/2021 | Litta et al. |
| 2021/0210489 | A1 | 7/2021 | Zhang et al. |
| 2021/0376076 | A1* | 12/2021 | Su ........................ H10D 30/014 |

OTHER PUBLICATIONS

Mertens, et al.; "Forksheet FETs for Advanced CMOS Scaling: Forksheet-Nanosheet Co-Integration and Dual Work Function Metal Gates at 17nm N-P Space," 2021 Symposium on VLSI Technology, Japan Society of Applied Physics (JASP), Jun. 13, 2021; 2 pages.

J. Zhang et al., "Full Bottom Dielectric Isolation to Enable Stacked Nanosheet Transistor for Low Power and High Performance Applications." International Electron Devices Meeting (IEDM), 2019, 11.6, 4 pp.

P. Weckx et al., "Novel forksheet device architecture as ultimate logic scaling device towards 2nm," International Electron Devices Meeting (IEDM), 2019, 36.5, 4 pp.

* cited by examiner

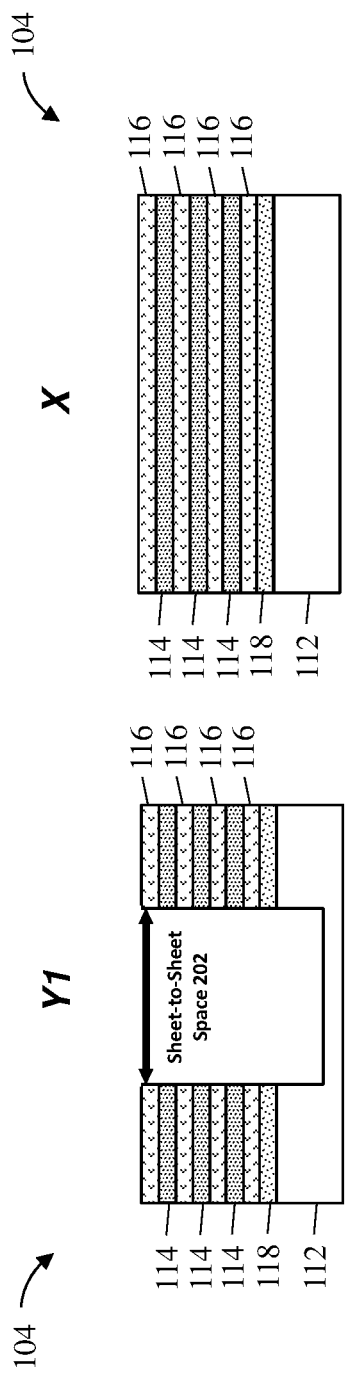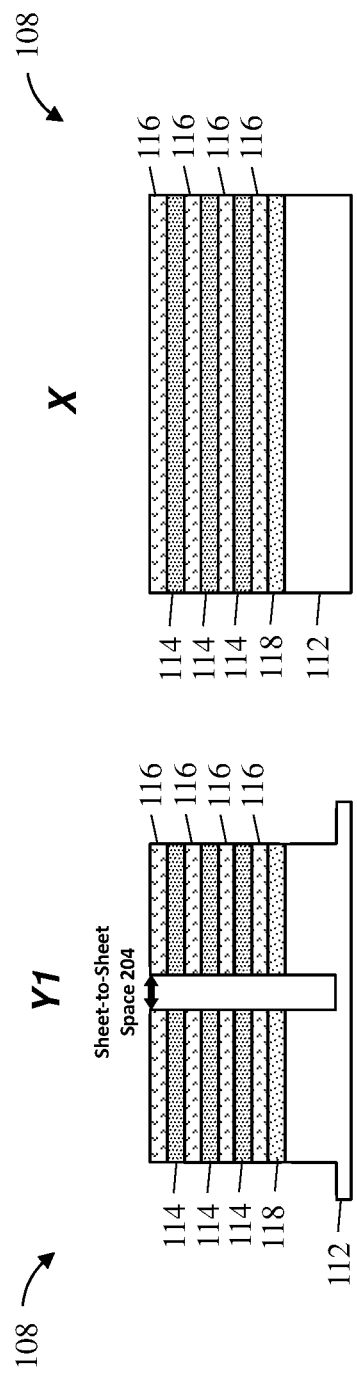

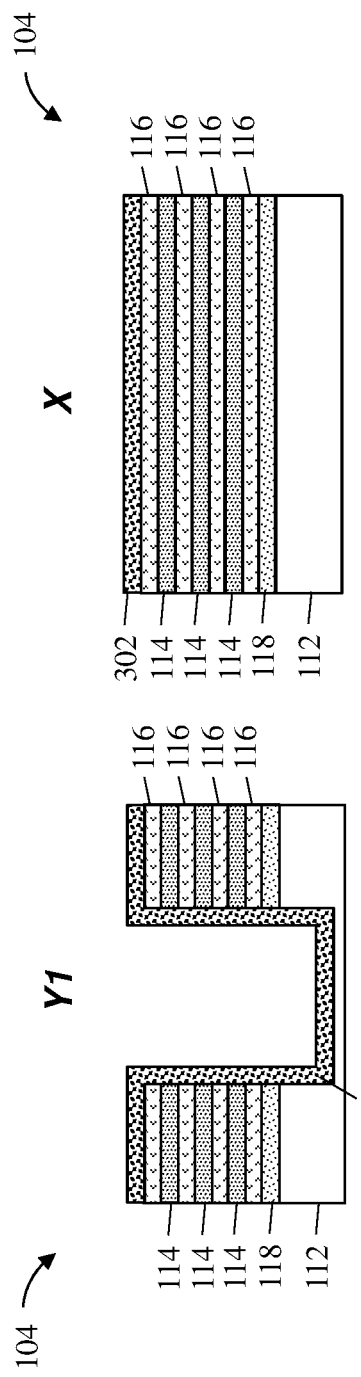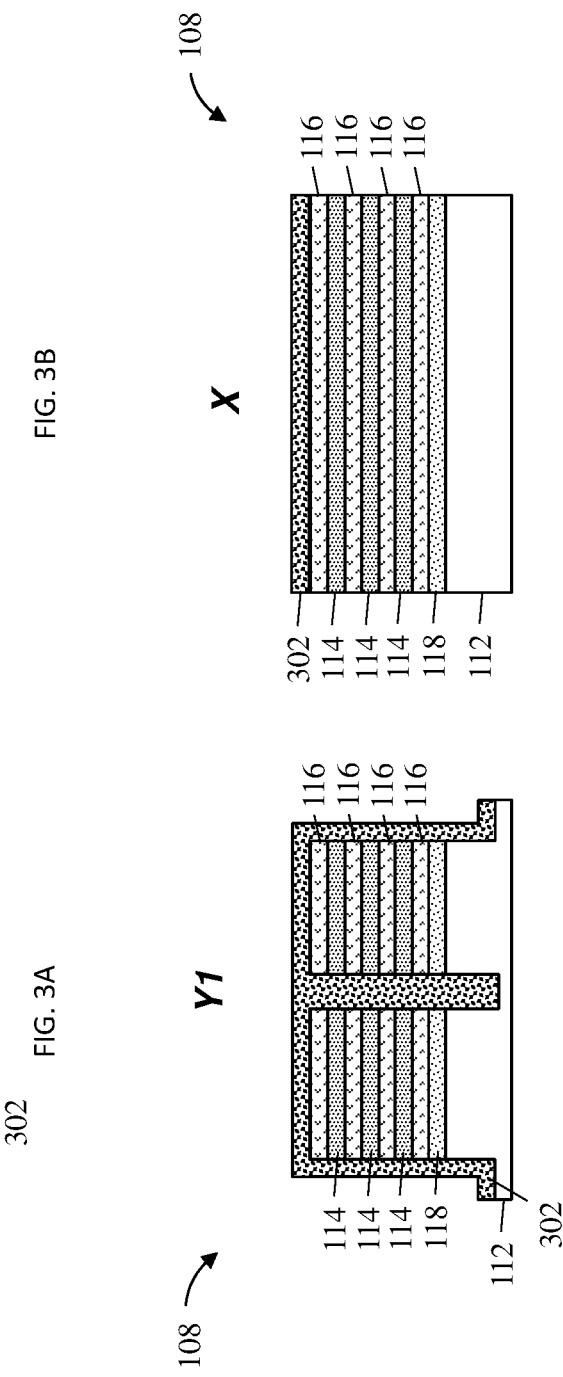

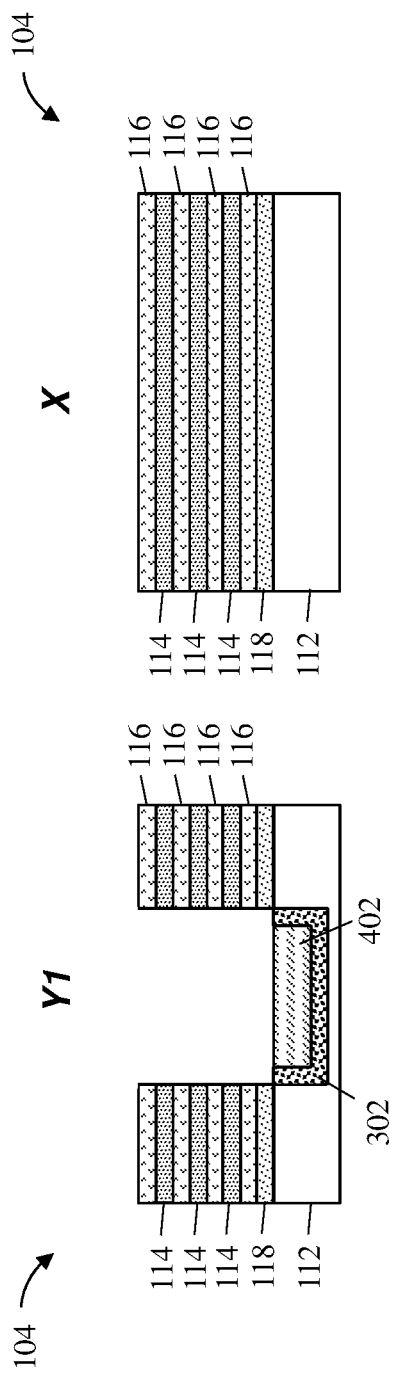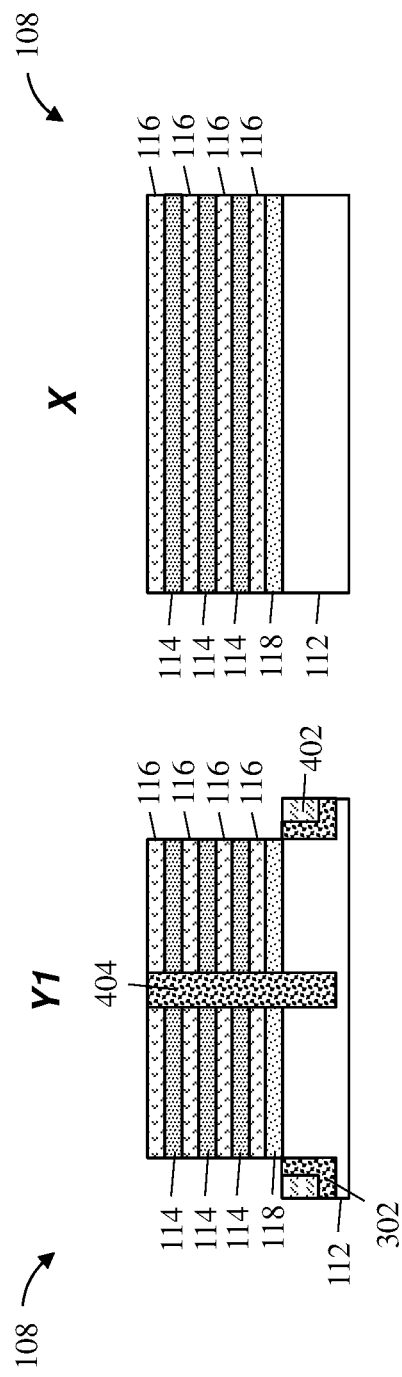

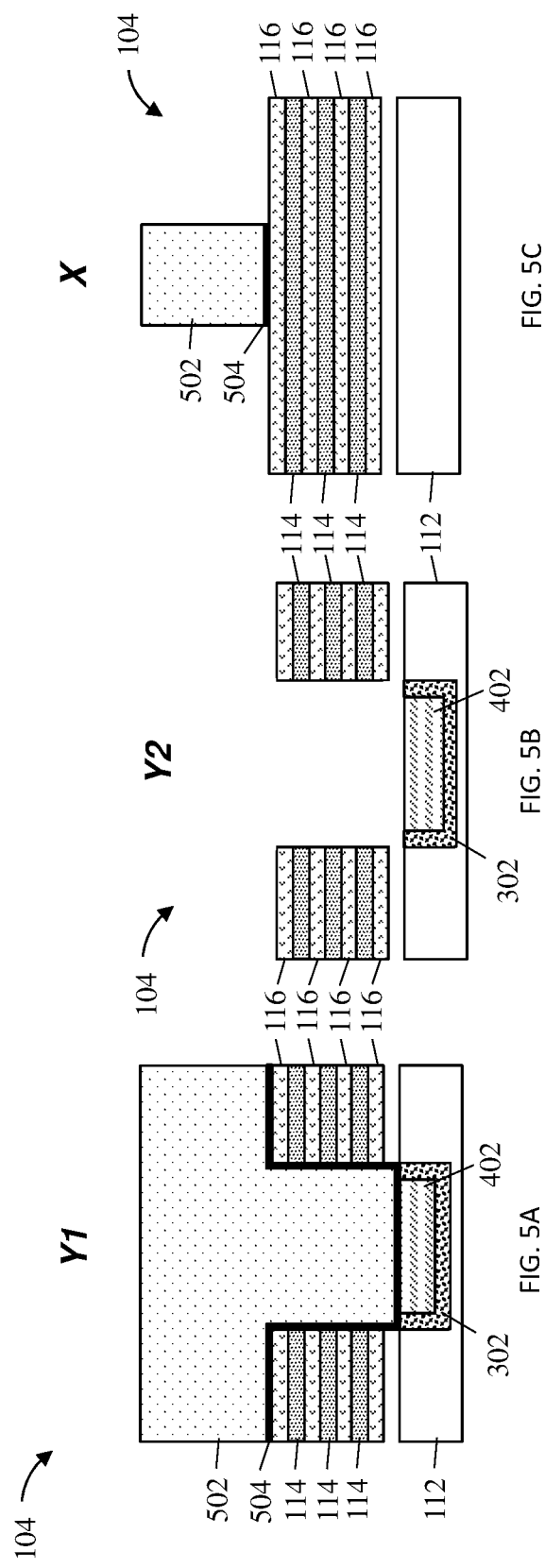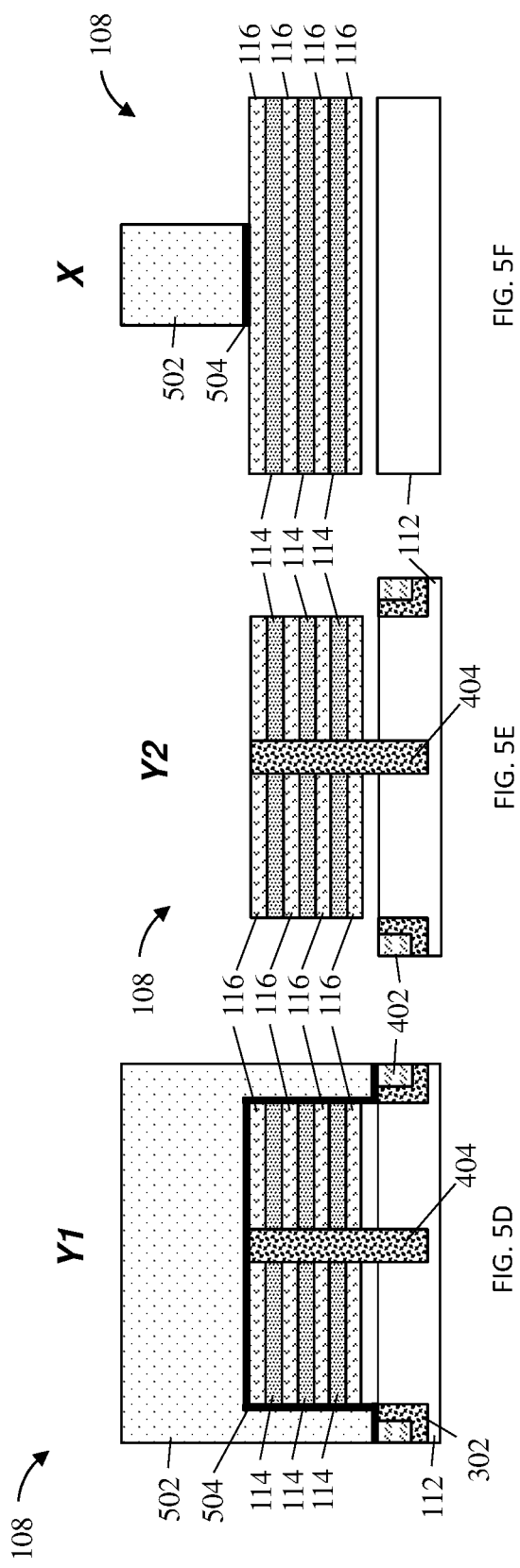

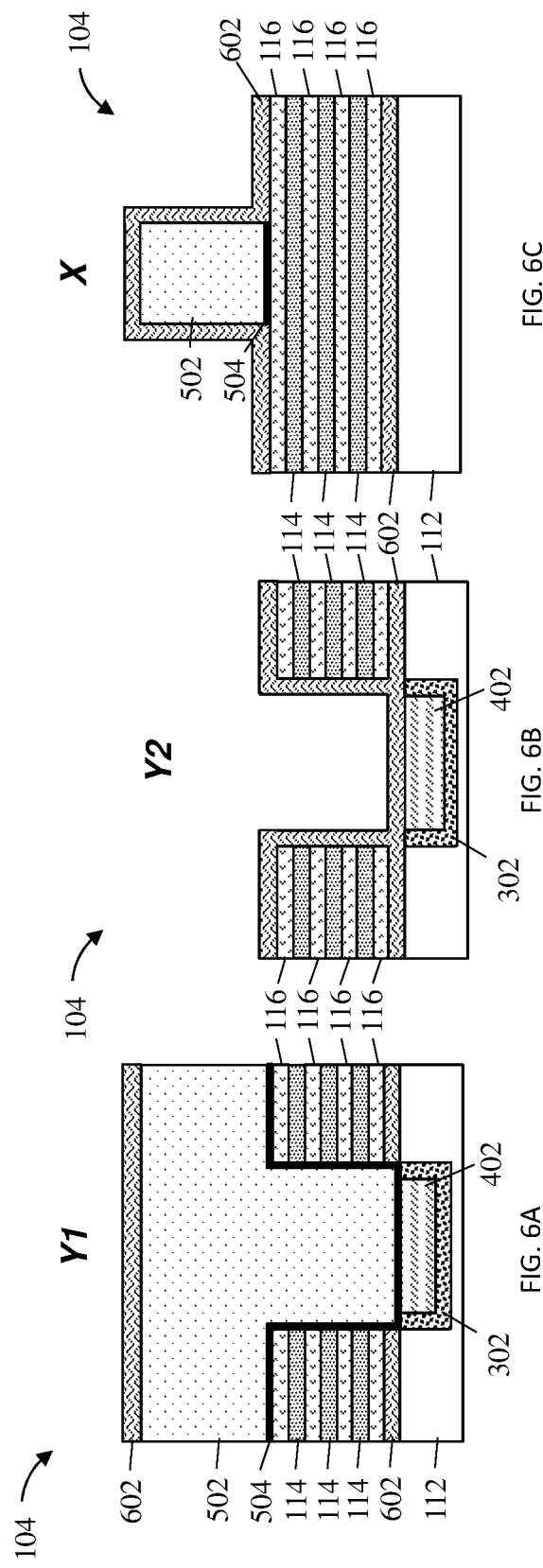
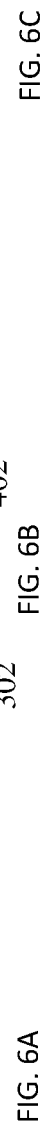
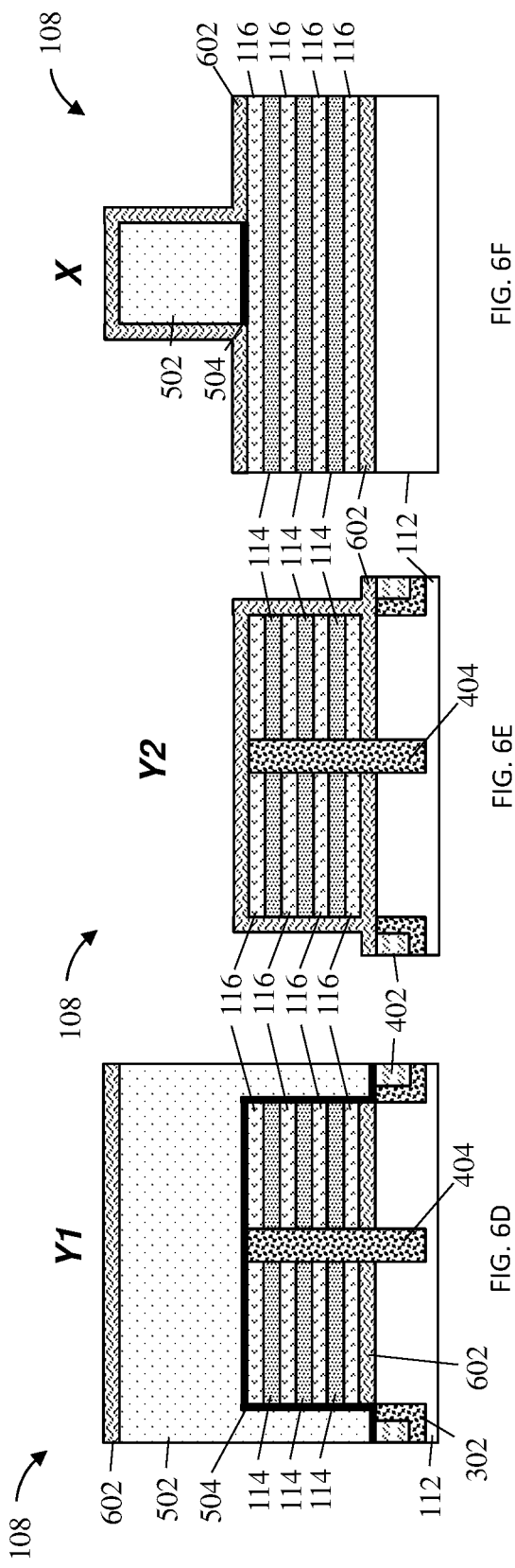

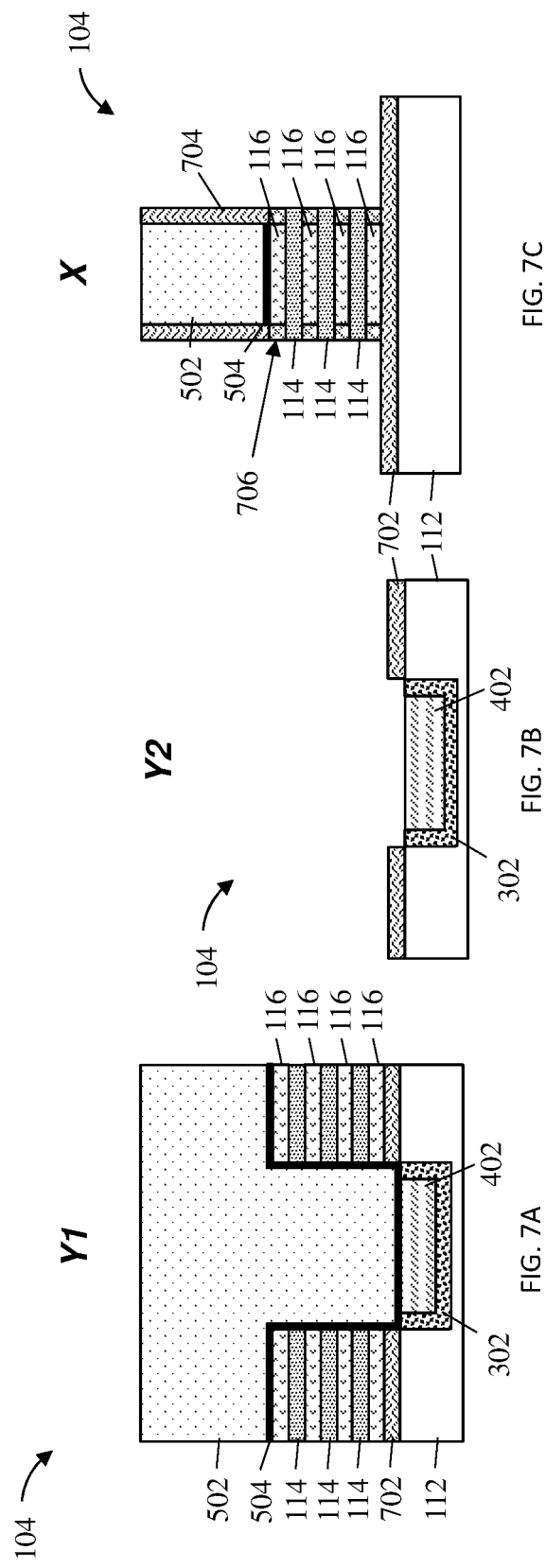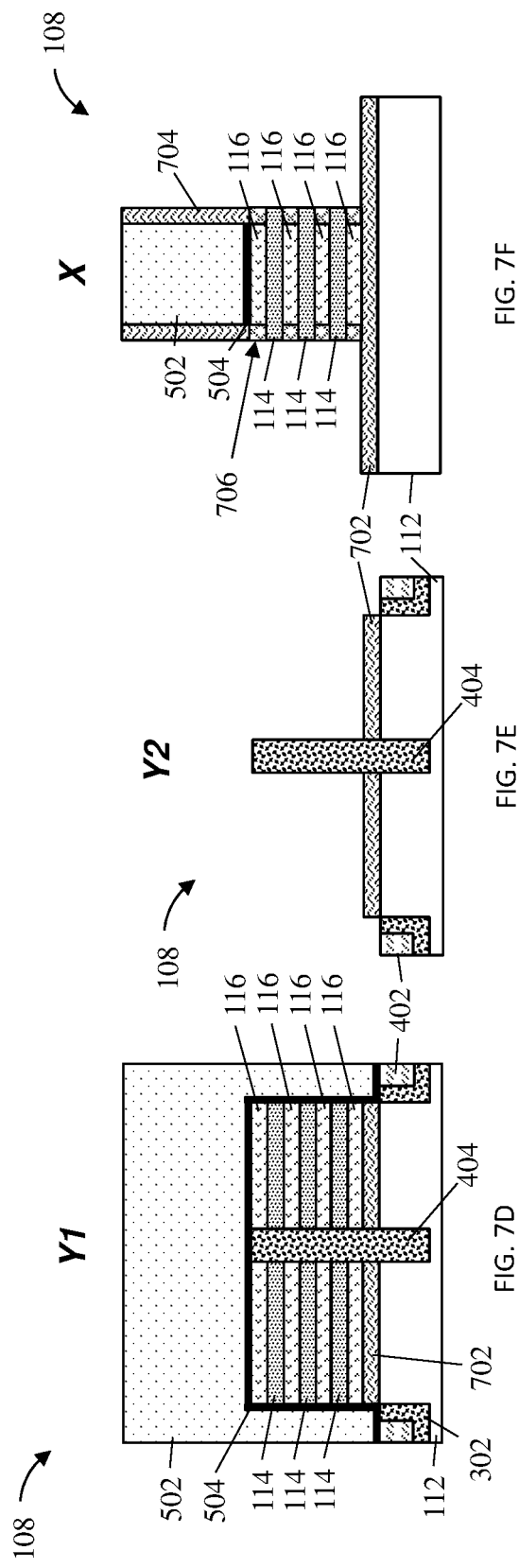

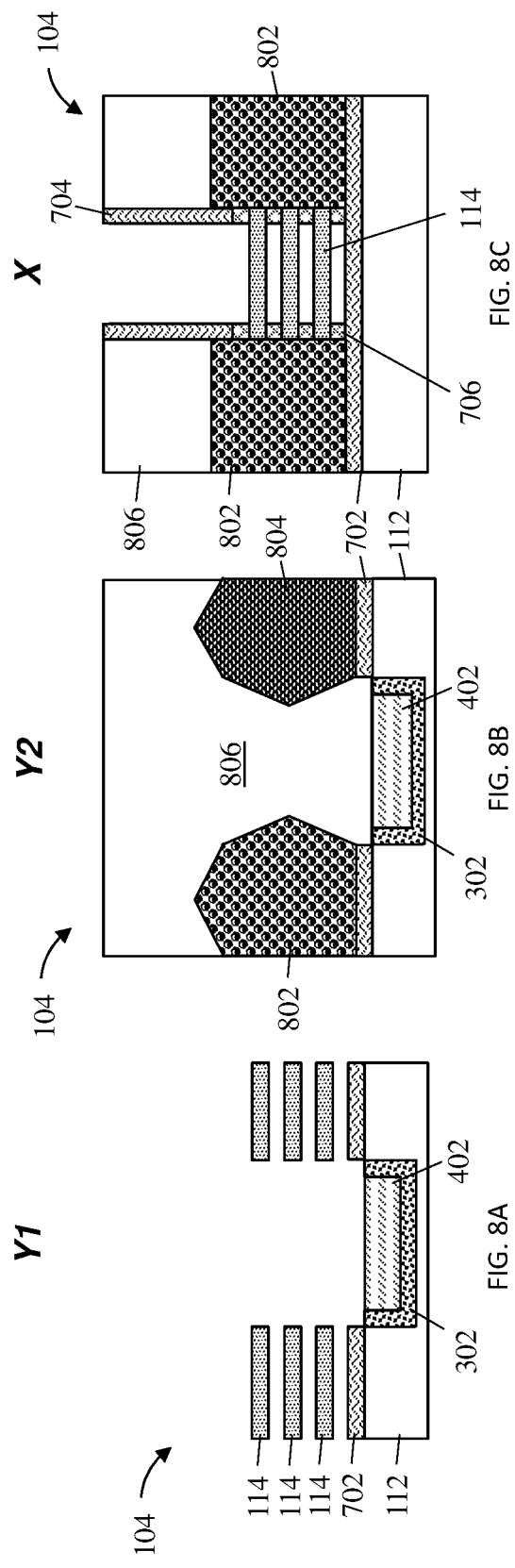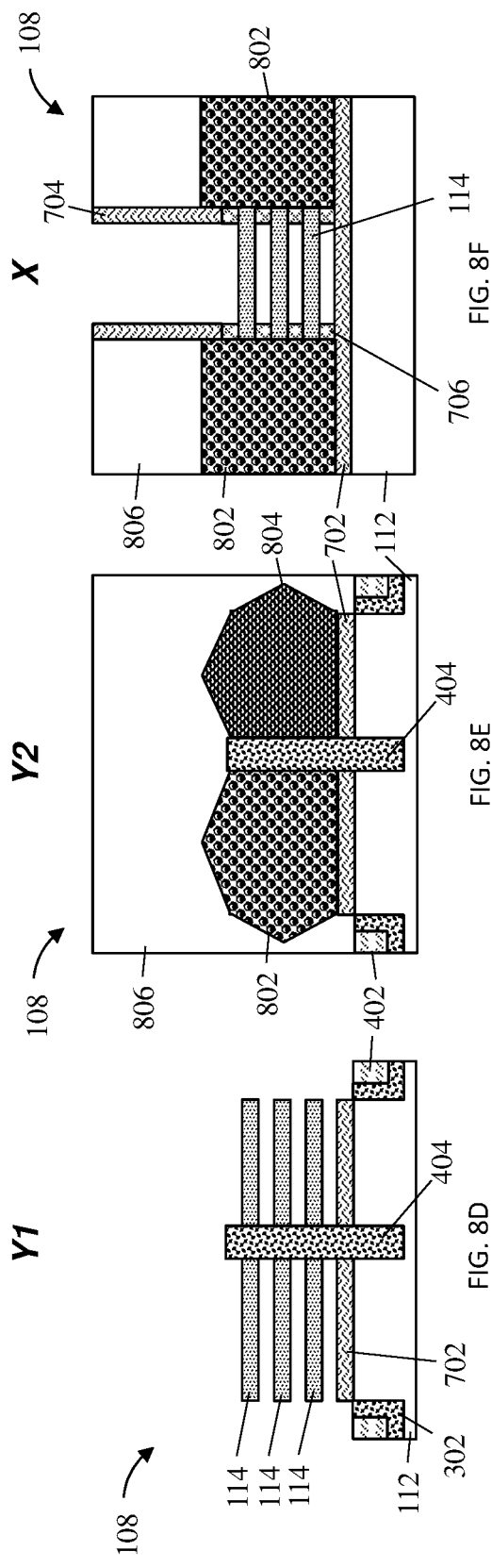

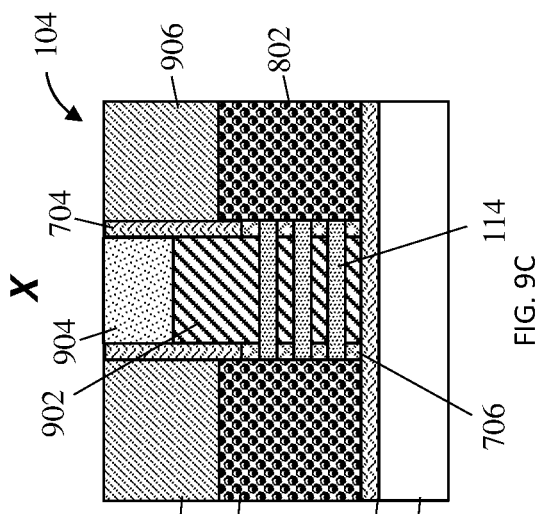
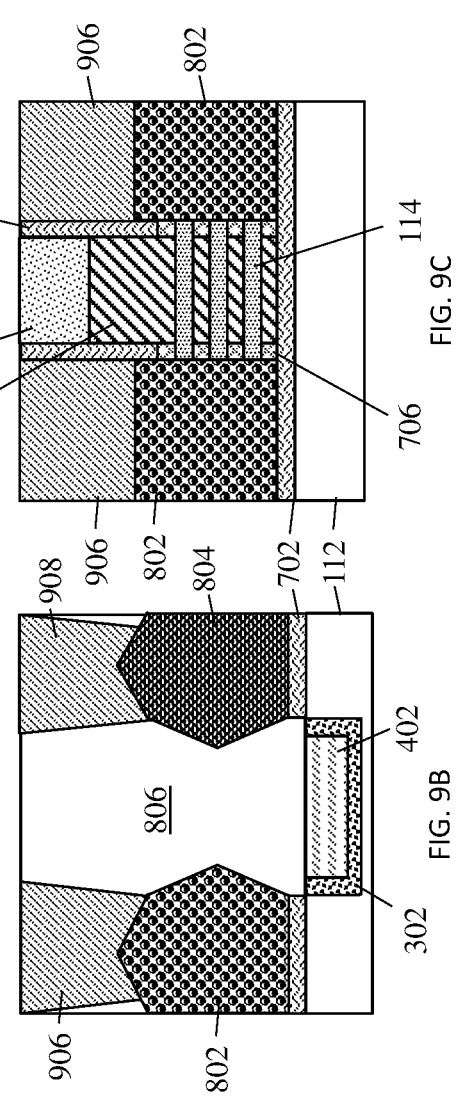
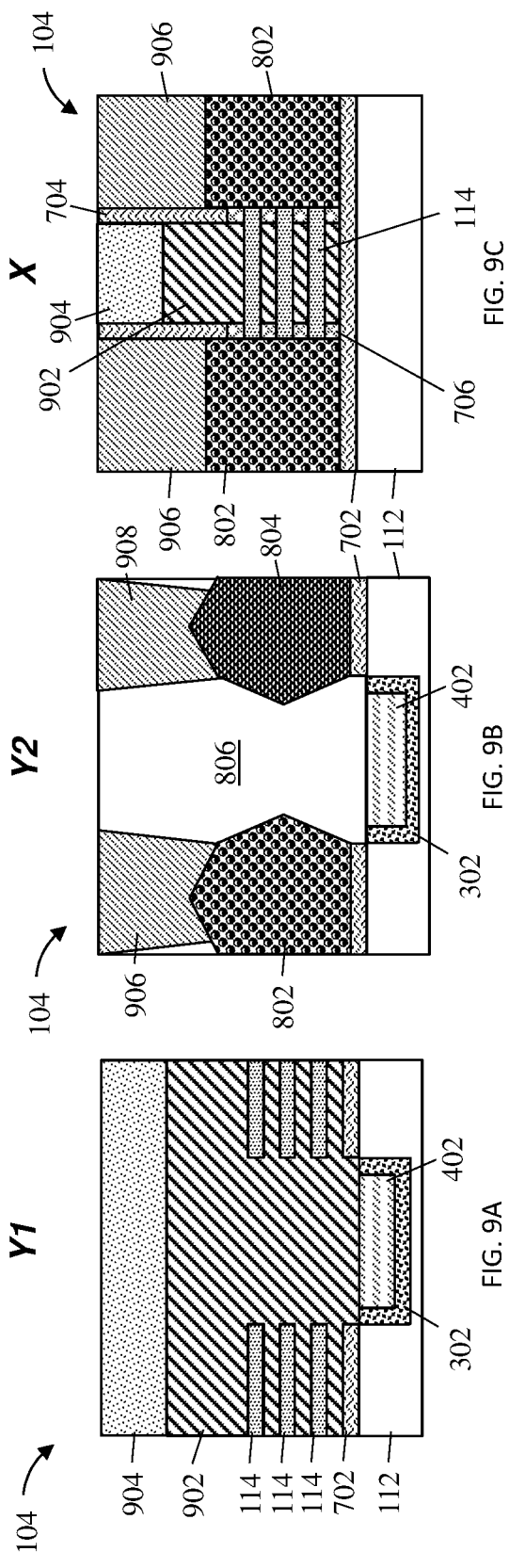
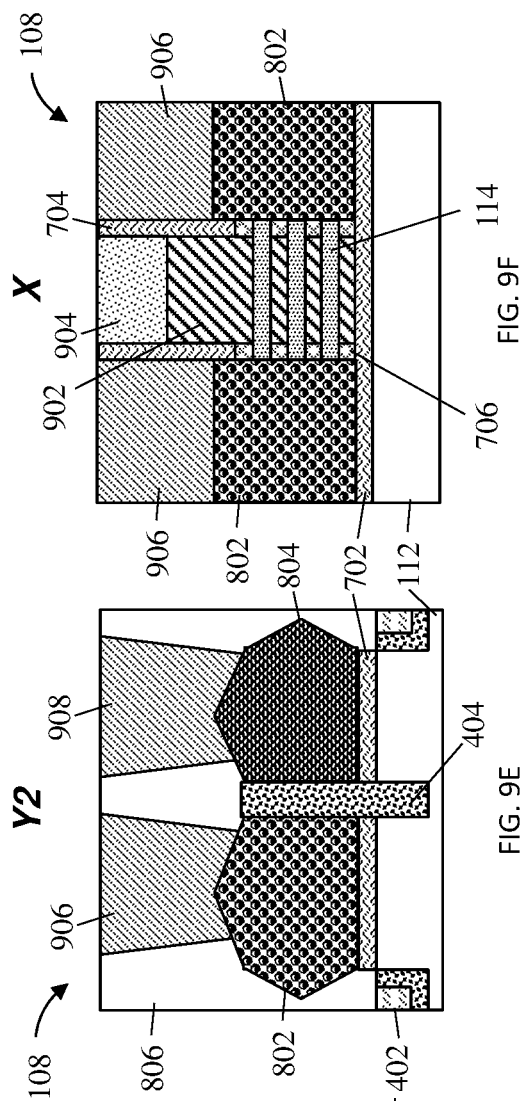
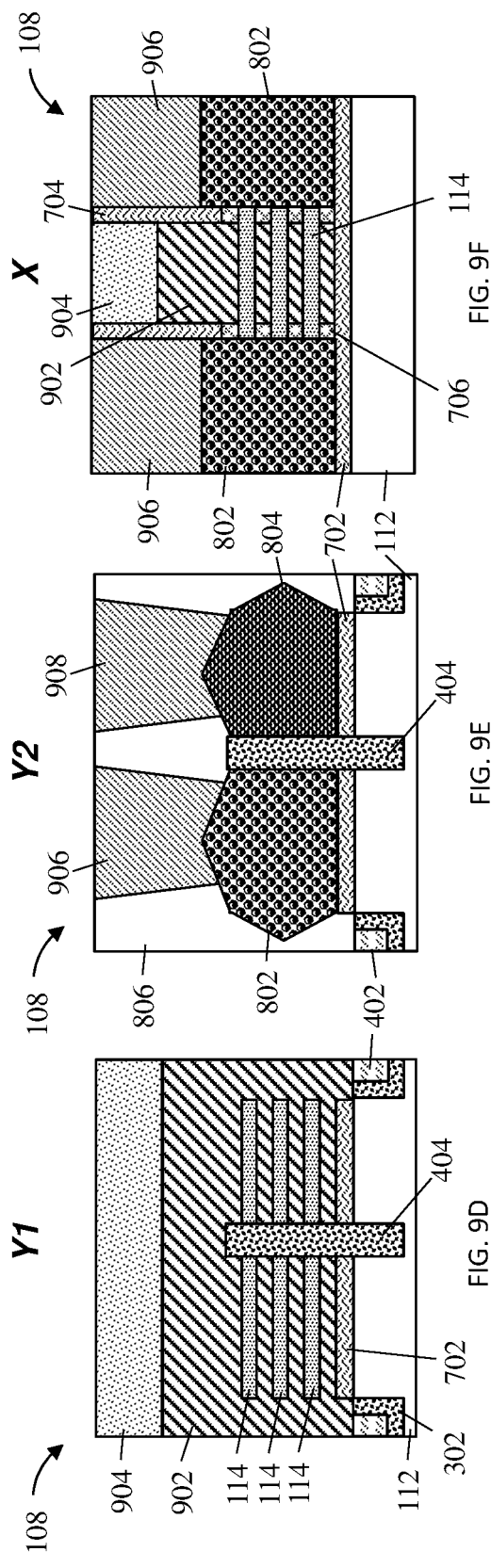

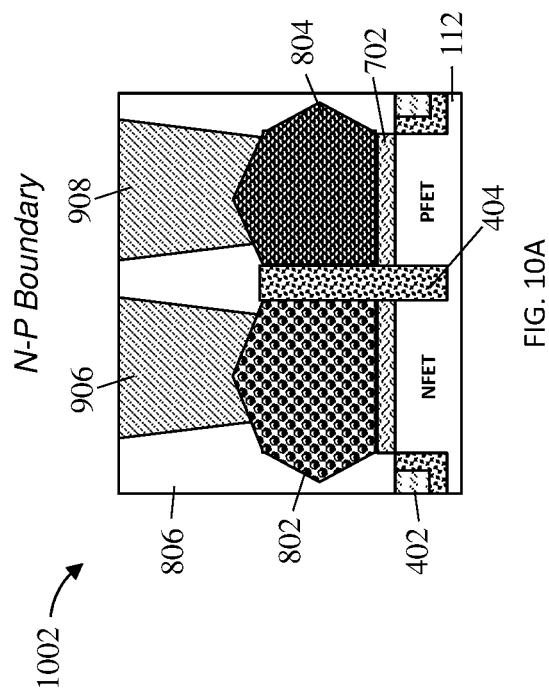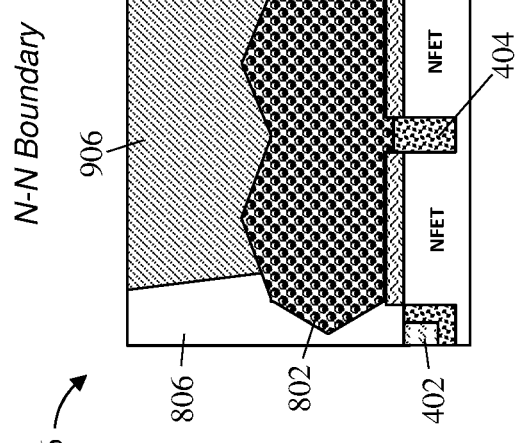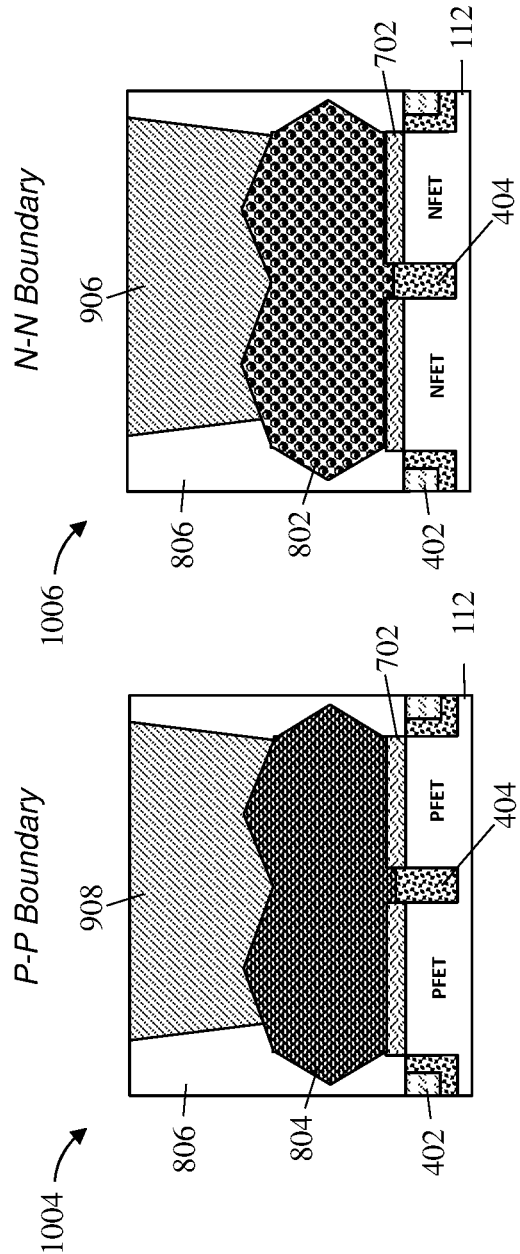

CO-INTEGRATING GATE-ALL-AROUND NANOSHEET TRANSISTORS AND COMB-NANOSHEET TRANSISTORS

BACKGROUND

The present invention generally relates to fabrication methods and resulting structures for semiconductor devices, and more specifically, to processing methods and resulting structures for co-integrating gate-all-around (GAA) nanosheet transistors and comb-nanosheet transistors.

Known metal oxide semiconductor field effect transistor (MOSFET) fabrication techniques include process flows for constructing planar field effect transistors (FETs). A planar FET includes a substrate (also referred to as a silicon slab); a gate formed over the substrate; source and drain regions formed on opposite ends of the gate; and a channel region near the surface of the substrate under the gate. The channel region electrically connects the source region to the drain region while the gate controls the current in the channel. The gate voltage controls whether the path from drain to source is an open circuit ("off") or a resistive path ("on").

In recent years, research has been devoted to the development of nonplanar transistor architectures. For example, nanosheet FETs include a non-planar architecture that provides increased device density and some increased performance over lateral devices. In nanosheet FETs, in contrast to conventional planar FETs, the channel is implemented as a plurality of stacked and spaced-apart nanosheets. The gate stack wraps around the full perimeter of each nanosheet, thus enabling fuller depletion in the channel region, and also reducing short-channel effects due to steeper subthreshold swing (SS) and smaller drain induced barrier lowering (DIBL).

SUMMARY

Embodiments of the invention are directed to a method for co-integrating gate-all-around (GAA) nanosheet and comb-nanosheet semiconductor devices. A non-limiting example of the method includes forming a GAA nanosheet device in a first region of a substrate. The GAA nanosheet device includes a first nanosheet stack, a second nanosheet stack, and a first fin spacing distance between the first nanosheet stack and the second nanosheet stack. A comb-nanosheet device is formed in a second region of a substrate. The comb-nanosheet device includes a third nanosheet stack, a fourth nanosheet stack, and a second fin spacing distance between the third nanosheet stack and the fourth nanosheet stack that is less than the first fin spacing distance.

Embodiments of the invention are directed to a semiconductor structure having co-integrated GAA nanosheet and comb-nanosheet devices. A non-limiting example of the semiconductor structure includes a GAA nanosheet device in a first region of a substrate. The GAA nanosheet device includes a first nanosheet stack, a second nanosheet stack, and a first fin spacing distance between the first nanosheet stack and the second nanosheet stack. The semiconductor structure further includes a comb-nanosheet device in a second region of a substrate. The comb-nanosheet device includes a third nanosheet stack, a fourth nanosheet stack, and a second fin spacing distance between the third nanosheet stack and the fourth nanosheet stack. The second fin spacing distance is less than the first fin spacing distance.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

FIG. 2A depicts a cross-sectional view of the GAA NS Region of the semiconductor structure taken along the line Y1 of the GAA NS reference view after a processing operation according to one or more embodiments of the invention;

FIG. 2B depicts a cross-sectional view of the GAA NS Region of the semiconductor structure taken along the line X of the GAA NS reference view after a processing operation according to one or more embodiments of the invention;

FIG. 2C depicts a cross-sectional view of the Comb-NS Region of the semiconductor structure taken along the line Y1 of the Comb-NS reference view after a processing operation according to one or more embodiments of the invention;

FIG. 2D depicts a cross-sectional view of the Comb-NS Region of the semiconductor structure taken along the line X of the Comb-NS reference view after a processing operation according to one or more embodiments of the invention;

FIG. 3A depicts a cross-sectional view of the GAA NS Region of the semiconductor structure taken along the line Y1 of the GAA NS reference view after a processing operation according to one or more embodiments of the invention;

FIG. 3B depicts a cross-sectional view of the GAA NS Region of the semiconductor structure taken along the line X of the GAA NS reference view after a processing operation according to one or more embodiments of the invention;

FIG. 3C depicts a cross-sectional view of the Comb-NS Region of the semiconductor structure taken along the line Y1 of the Comb-NS reference view after a processing operation according to one or more embodiments of the invention;

FIG. 3D depicts a cross-sectional view of the Comb-NS Region of the semiconductor structure taken along the line X of the Comb-NS reference view after a processing operation according to one or more embodiments of the invention;

FIG. 4A depicts a cross-sectional view of the GAA NS Region of the semiconductor structure taken along the line Y1 of the GAA NS reference view after a processing operation according to one or more embodiments of the invention;

FIG. 4B depicts a cross-sectional view of the GAA NS Region of the semiconductor structure taken along the line X of the GAA NS reference view after a processing operation according to one or more embodiments of the invention;

FIG. 4C depicts a cross-sectional view of the Comb-NS Region of the semiconductor structure taken along the line Y1 of the Comb-NS reference view after a processing operation according to one or more embodiments of the invention;

FIG. 4D depicts a cross-sectional view of the Comb-NS Region of the semiconductor structure taken along the line X of the Comb-NS reference view after a processing operation according to one or more embodiments of the invention;

FIG. 5A depicts a cross-sectional view of the GAA NS Region of the semiconductor structure taken along the line Y1 of the GAA NS reference view after a processing operation according to one or more embodiments of the invention;

FIG. 5B depicts a cross-sectional view of the GAA NS Region of the semiconductor structure taken along the line Y2 of the GAA NS reference view after a processing operation according to one or more embodiments of the invention;

FIG. 5C depicts a cross-sectional view of the GAA NS Region of the semiconductor structure taken along the line X of the GAA NS reference view after a processing operation according to one or more embodiments of the invention;

FIG. 5D depicts a cross-sectional view of the Comb-NS Region of the semiconductor structure taken along the line Y1 of the Comb-NS reference view after a processing operation according to one or more embodiments of the invention;

FIG. 5E depicts a cross-sectional view of the Comb-NS Region of the semiconductor structure taken along the line Y2 of the Comb-NS reference view after a processing operation according to one or more embodiments of the invention;

FIG. 5F depicts a cross-sectional view of the Comb-NS Region of the semiconductor structure taken along the line X of the Comb-NS reference view after a processing operation according to one or more embodiments of the invention;

FIG. 6A depicts a cross-sectional view of the GAA NS Region of the semiconductor structure taken along the line Y1 of the GAA NS reference view after a processing operation according to one or more embodiments of the invention;

FIG. 6B depicts a cross-sectional view of the GAA NS Region of the semiconductor structure taken along the line Y2 of the GAA NS reference view after a processing operation according to one or more embodiments of the invention;

FIG. 6C depicts a cross-sectional view of the GAA NS Region of the semiconductor structure taken along the line X of the GAA NS reference view after a processing operation according to one or more embodiments of the invention;

FIG. 6D depicts a cross-sectional view of the Comb-NS Region of the semiconductor structure taken along the line Y1 of the Comb-NS reference view after a processing operation according to one or more embodiments of the invention;

FIG. 6E depicts a cross-sectional view of the Comb-NS Region of the semiconductor structure taken along the line Y2 of the Comb-NS reference view after a processing operation according to one or more embodiments of the invention;

FIG. 6F depicts a cross-sectional view of the Comb-NS Region of the semiconductor structure taken along the line X of the Comb-NS reference view after a processing operation according to one or more embodiments of the invention;

FIG. 7A depicts a cross-sectional view of the GAA NS Region of the semiconductor structure taken along the line Y1 of the GAA NS reference view after a processing operation according to one or more embodiments of the invention;

FIG. 7B depicts a cross-sectional view of the GAA NS Region of the semiconductor structure taken along the line Y2 of the GAA NS reference view after a processing operation according to one or more embodiments of the invention;

FIG. 7C depicts a cross-sectional view of the GAA NS Region of the semiconductor structure taken along the line X of the GAA NS reference view after a processing operation according to one or more embodiments of the invention;

FIG. 7D depicts a cross-sectional view of the Comb-NS Region of the semiconductor structure taken along the line Y1 of the Comb-NS reference view after a processing operation according to one or more embodiments of the invention;

FIG. 7E depicts a cross-sectional view of the Comb-NS Region of the semiconductor structure taken along the line Y2 of the Comb-NS reference view after a processing operation according to one or more embodiments of the invention;

FIG. 7F depicts a cross-sectional view of the Comb-NS Region of the semiconductor structure taken along the line X of the Comb-NS reference view after a processing operation according to one or more embodiments of the invention;

FIG. 8A depicts a cross-sectional view of the GAA NS Region of the semiconductor structure taken along the line Y1 of the GAA NS reference view after a processing operation according to one or more embodiments of the invention;

FIG. 8B depicts a cross-sectional view of the GAA NS Region of the semiconductor structure taken along the line Y2 of the GAA NS reference view after a processing operation according to one or more embodiments of the invention;

FIG. 8C depicts a cross-sectional view of the GAA NS Region of the semiconductor structure taken along the line X of the GAA NS reference view after a processing operation according to one or more embodiments of the invention;

FIG. 8D depicts a cross-sectional view of the Comb-NS Region of the semiconductor structure taken along the line Y1 of the Comb-NS reference view after a processing operation according to one or more embodiments of the invention;

FIG. 8E depicts a cross-sectional view of the Comb-NS Region of the semiconductor structure taken along the line Y2 of the Comb-NS reference view after a processing operation according to one or more embodiments of the invention;

FIG. 8F depicts a cross-sectional view of the Comb-NS Region of the semiconductor structure taken along the line X of the Comb-NS reference view after a processing operation according to one or more embodiments of the invention;

FIG. 9A depicts a cross-sectional view of the GAA NS Region of the semiconductor structure taken along the line Y1 of the GAA NS reference view after a processing operation according to one or more embodiments of the invention;

FIG. 9B depicts a cross-sectional view of the GAA NS Region of the semiconductor structure taken along the line Y2 of the GAA NS reference view after a processing operation according to one or more embodiments of the invention;

FIG. 9C depicts a cross-sectional view of the GAA NS Region of the semiconductor structure taken along the line X of the GAA NS reference view after a processing operation according to one or more embodiments of the invention;

FIG. 9D depicts a cross-sectional view of the Comb-NS Region of the semiconductor structure taken along the line Y1 of the Comb-NS reference view after a processing operation according to one or more embodiments of the invention;

FIG. 9E depicts a cross-sectional view of the Comb-NS Region of the semiconductor structure taken along the line Y2 of the Comb-NS reference view after a processing operation according to one or more embodiments of the invention;

FIG. 9F depicts a cross-sectional view of the Comb-NS Region of the semiconductor structure taken along the line X of the Comb-NS reference view after a processing operation according to one or more embodiments of the invention;

FIG. 10A depicts a cross-sectional view of a semiconductor structure having an N-P Boundary according to one or more embodiments of the invention;

FIG. 10B depicts a cross-sectional view of a semiconductor structure having a P-P Boundary according to one or more embodiments of the invention;

FIG. 10C depicts a cross-sectional view of a semiconductor structure having an N-N Boundary according to one or more embodiments of the invention.

Figure 1:
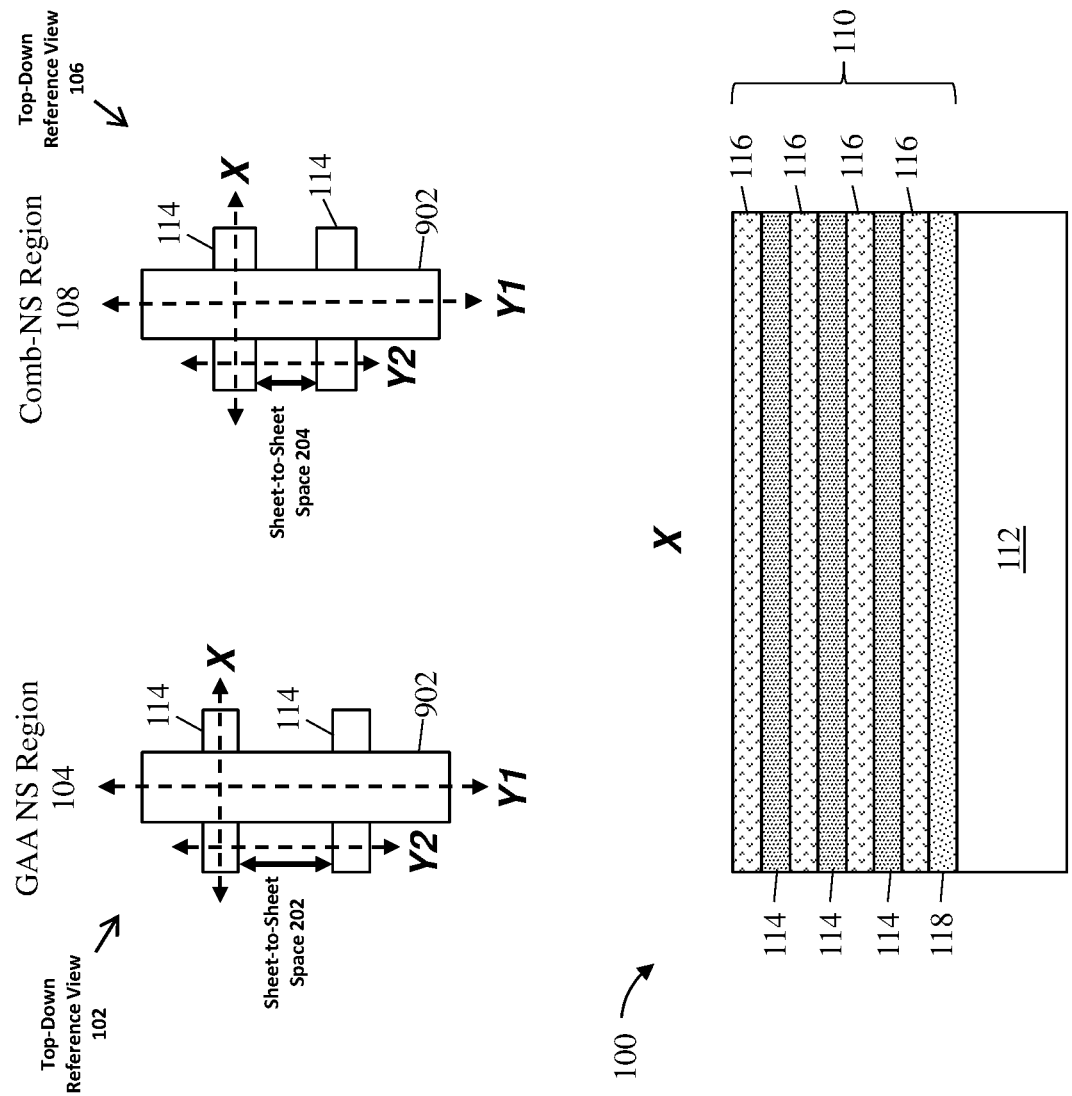
FIG. 1 depicts a cross-sectional view and top-down reference views of a semiconductor structure after an initial set of processing operations according to one or more embodiments of the invention.

The diagrams depicted herein are illustrative. There can be many variations to the diagram or the operations described therein without departing from the spirit of the invention. For instance, the actions can be performed in a differing order or actions can be added, deleted or modified.

In the accompanying figures and following detailed description of the described embodiments of the invention, the various elements illustrated in the figures are provided with two or three-digit reference numbers. With minor exceptions, the leftmost digit(s) of each reference number correspond to the figure in which its element is first illustrated.

DETAILED DESCRIPTION

It is understood in advance that although example embodiments of the invention are described in connection with a particular transistor architecture, embodiments of the invention are not limited to the particular transistor architectures or materials described in this specification. Rather, embodiments of the present invention are capable of being implemented in conjunction with any other type of transistor architecture or materials now known or later developed.

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Turning now to an overview of technologies that are more specifically relevant to aspects of the present invention, ICs are fabricated in a series of stages, including a front-end-of-line (FEOL) stage, a middle-of-line (MOL) stage, and a back-end-of-line (BEOL) stage. The process flows for fabricating modern ICs are often identified based on whether the process flows fall in the FEOL stage, the MOL stage, or the BEOL stage. Generally, the FEOL stage is where device elements (e.g., transistors, capacitors, resistors, etc.) are patterned in the semiconductor substrate/wafer. The FEOL stage processes include wafer preparation, isolation, gate patterning, and the formation of wells, source/drain (S/D) regions, extension junctions, silicide regions, and liners. The MOL stage typically includes process flows for forming the contacts (e.g., CA) and other structures that communicatively couple to active regions (e.g., gate, source, and drain) of the device element. For example, the silicidation of source/drain regions, as well as the deposition of metal contacts, can occur during the MOL stage to connect the elements patterned during the FEOL stage. Layers of interconnections (e.g., metallization layers) are formed above these logical and functional layers during the BEOL stage to complete the IC. Most ICs need more than one layer of wires to form all the necessary connections, and as many as 5-12 layers are added in the BEOL process. The various BEOL layers are interconnected by vias that couple from one layer to another. Insulating dielectric materials are used throughout the layers of an IC to perform a variety of functions, including stabilizing the IC structure and providing electrical isolation of the IC elements. For example, the metal interconnecting wires in the BEOL region of the IC are isolated by dielectric layers to prevent the wires from creating a short circuit with other metal layers.

There are a few candidates for scaling nonplanar transistors beyond the 7 nm node, but each is currently limited due to various factors. One candidate is the gate-all-around (GAA) nanosheet transistor architecture. To increase the available computing power per unit area, GAA nanosheet devices vertically stack channels over a shared substrate footprint. The resultant transistor offers several improvements over planar and fin-type devices, such as an increase in gate control, allowing for lower threshold voltages (VDD). Other improvements include variable device widths (additional design flexibility) and longer device widths (improved PPAC).

There are challenges, however, to the continued scaling of GAA nanosheet transistors. Once challenge is the difficulty in sufficiently reducing the sheet-to-sheet space between nanosheet stacks in CMOS devices. This represents an area penalty that limits nanosheet scaling benefits. A recent attempt to solve sheet-to-sheet space scaling is the so-called comb-type nanosheet (also referred to as the forksheet or comb-nanosheet). The comb-nanosheet offers a reduced sheet space as compared to a GAA nanosheet and can achieve a combined CMOS area scaling improvement of 20 percent or more. Unfortunately, current chip fabrication schemes do not co-integrate GAA nanosheets and comb-nanosheets on the same chip, forcing fabricators to choose one nanosheet type over the other.

Turning now to an overview of aspects of the present invention, one or more embodiments of the invention address the above-described shortcomings by providing processing methods and resulting structures for co-integrating GAA nanosheets and comb-nanosheets on the same chip, wafer, or substrate. In accordance with embodiments of the invention, GAA nanosheet devices are formed in a first region of the wafer, while comb-nanosheet devices are formed in a second region of the wafer.

To achieve co-integration, a nanosheet stack is formed over a substrate and patterned to a first fin-to-fin spacing in the first region of the wafer and a second, shorter fin-to-fin spacing in the second region of the wafer. A shallow trench isolation (STI) liner is deposited over both regions to define the STI region. The STI liner serves dual purposes, also acting as a dielectric pillar for the comb-nanosheet. The STI region is filled and fabrication continues using replacement metal gate (RMG) processes, or so-called gate-first processes.

Co-integrating GAA nanosheets with comb-nanosheets enables power-performance-area tailoring depending on the device characteristics need. In other words, the different advantages of each nanosheet type can be leveraged as desired to emphasize either performance or density in various regions of the wafer/chip. For example, GAA nanosheet devices can be used for performance logic with a large number of tracks, while comb-nanosheet devices can be used for dense logic or memory cells with a small number of tracks.

Advantageously, the present co-integration scheme results in GAA nanosheets and comb-nanosheets having the same number of sheets, at the same stack height. Moreover, both GAA nanosheet and comb-nanosheet devices offer bottom dielectric isolation in both gate and S/D regions. In addition, the present co-integration scheme can be integrated into current fabrication workflows with minimal disruption with no additional masks.

Turning now to a more detailed description of fabrication operations and resulting structures according to aspects of the invention, FIGS. 1-9F depict a semiconductor structure 100 after various fabrication operations in accordance with aspects of the invention. Although the cross-sectional diagrams depicted in FIGS. 1-9F are two-dimensional, it is understood that the diagrams depicted in FIGS. 1-9F represent three-dimensional structures. The top-down reference view 102 shown in FIG. 1 provides a reference point for the various cross-sectional views: X-view (across gate in channel region), Y1-view (along gate in channel region), and Y2-view (along gate in source/drain region) for the GAA NS Region 104 shown in FIGS. 1-9F. The top-down reference view 106 shown in FIG. 1 provides a reference point for the various cross-sectional views: X-view (across gate in channel region), Y1-view (along gate in channel region), and Y2-view (along gate in source/drain region) for the comb-NS Region 108 shown in FIGS. 1-9F.

FIG. 1 depicts a cross-sectional view of the semiconductor structure 100 taken along the line X of the reference views 102 and 106 after an initial set of fabrication operations have been applied as part of a method of fabricating a final semiconductor device according to one or more embodiments of the invention. In some embodiments of the invention, a nanosheet stack(s) 110 are formed over a substrate 112.

The substrate 112 can be made of any suitable substrate material, such as, for example, monocrystalline Si, silicon germanium (SiGe), III-V compound semiconductor, II-VI compound semiconductor, or semiconductor-on-insulator (SOI). Group III-V compound semiconductors, for example, include materials having at least one group III element and at least one group V element, such as one or more of aluminum gallium arsenide (AlGaAs), aluminum gallium nitride (AlGaN), aluminum arsenide (AlAs), aluminum indium arsenide (AlInAs), aluminum nitride (AlN), gallium antimonide (GaSb), gallium aluminum antimonide (GaAlSb), gallium arsenide (GaAs), gallium arsenide antimonide (GaAsSb), gallium nitride (GaN), indium antimonide (InSb), indium arsenide (InAs), indium gallium arsenide (InGaAs), indium gallium arsenide phosphide (InGaAsP), indium gallium nitride (InGaN), indium nitride (InN), indium phosphide (InP) and alloy combinations including at least one of the foregoing materials. The alloy combinations can include binary (two elements, e.g., gallium (III) arsenide (GaAs)), ternary (three elements, e.g., InGaAs) and quaternary (four elements, e.g., aluminum gallium indium phosphide (AlInGaP)) alloys.

In some embodiments of the invention, the substrate 112 can include a buried oxide layer (not separately shown) in a silicon-on-insulator (SOI) configuration. The buried oxide layer can be made of any suitable dielectric material, such as, for example, a silicon oxide. In some embodiments of the invention, the buried oxide layer is formed to a thickness of about 10-200 nm, although other thicknesses are within the contemplated scope of the invention. In some embodiments of the invention, the semiconductor structure 100 can also be formed without the buried oxide layer. In that case, the STI (shallow trench isolation, discussed later) will serve to isolate device from device.

In some embodiments of the invention, the nanosheet stack 110 can include one or more semiconductor layers 114 alternating with one or more sacrificial layers 116. In some embodiments of the invention, the semiconductor layers 114 and the sacrificial layers 116 are epitaxially grown layers. For ease of discussion reference is made to operations performed on and to a nanosheet stack having three nanosheets (e.g., the three semiconductor layers 114 shown in FIG. 1) alternating with four sacrificial layers (e.g., the four sacrificial layers 116). It is understood, however, that the nanosheet stack 110 can include any number of nanosheets alternating with a corresponding number of sacrificial layers. For example, the nanosheet stack 110 can include two nanosheets, five nanosheets, eight nanosheets, 30 nanosheets (e.g., 3D NAND), or any number of nanosheets, along with a corresponding number of sacrificial layers (i.e., as appropriate to form a nanosheet stack having a bottommost sacrificial layer under a bottommost nanosheet and a sacrificial layer between each pair of adjacent nanosheets).

The semiconductor layers 114 can be made of any suitable material such as, for example, monocrystalline silicon or silicon germanium. In some embodiments of the invention, the semiconductor layers 114 are silicon nanosheets. In some embodiments of the invention, the semiconductor layers 114 have a thickness of about 4 nm to about 15 nm, for example 6 nm, although other thicknesses are within the contemplated scope of the invention. In some embodiments of the invention, the substrate 112 and the semiconductor layers 114 can be made of a same semiconductor material. In other embodiments of the invention, the substrate 112 can be made of a first semiconductor material, and the semiconductor layers 114 can be made of a second, different semiconductor material.

The sacrificial layers 116 can be silicon or silicon germanium layers, depending on the material of the semiconductor layers 114 to meet etch selectivity requirements. For example, in embodiments where the semiconductor layers 114 are silicon nanosheets, the sacrificial layers 116 can be silicon germanium layers. In embodiments where the semiconductor layers 114 are silicon germanium nanosheets, the sacrificial layers 116 can be silicon germanium layers having a germanium concentration that is greater than the germanium concentration in the semiconductor layers 114. For example, if the semiconductor layers 114 are silicon germanium having a germanium concentration of 5 percent (sometimes referred to as SiGe5), the sacrificial layers 116 can be silicon germanium layers having a germanium concentration of about 25 (SiGe25), although other germanium concentrations are within the contemplated scope of the invention. In some embodiments of the invention, the sacrificial layers 116 have a thickness of about 8 nm to about 15 nm, for example 10 nm, although other thicknesses are within the contemplated scope of the invention.

As further shown in FIG. 1, the nanosheet stack 110 can include a sacrificial isolation layer 118 positioned between the bottommost layer of the sacrificial layers 116 and the substrate 112. The sacrificial isolation layer 118 can be a silicon germanium layer having a germanium concentration that varies depending on the material of the sacrificial layers 116 to meet etch selectivity requirements (i.e., to ensure that the semiconductor layers 114, the sacrificial layers 116, and the sacrificial isolation layer 118 will have mutual etch selectivity with respect to one another). For example, in embodiments where the sacrificial layers 116 are silicon germanium nanosheets, the sacrificial isolation layer 118 can be a silicon germanium layer having a germanium concentration that is greater than the germanium concentration in the sacrificial layers 116. For example, if the sacrificial layers 116 are silicon germanium layers having a germanium concentration of 25 percent (SiGe25), the sacrificial isolation layer 118 can be a silicon germanium layer having a germanium concentration of about 60 percent (SiGe60), although other germanium concentrations are within the contemplated scope of the invention. In some embodiments of the invention, the sacrificial isolation layer 118 has a thickness of about 8 nm to about 15 nm, for example 10 nm, although other thicknesses are within the contemplated scope of the invention.

FIGS. 2A and 2B depict cross-sectional views of the GAA NS Region 104 of the semiconductor structure 100 taken along the lines Y1 and X, respectively, of the reference view 102 after a processing operation according to one or more embodiments of the invention. As shown in the cross-sectional view taken along the line Y1, portions of the nanosheet stack 110 can be removed to define a sheet-to-sheet space 202 (and the respective stack widths). The sheet-to-sheet space 202 defines the N2N, P2P, or N2P distance in the final device, depending on the configuration of the respective nanosheets (e.g., NFET/NFET, PFET/PFET, NFET/PFET, see FIGS. 10A, 10B, and 10C). In some embodiments of the invention, the width of the nanosheet stack 110 is about 10-100 nm, although other widths are within the contemplated scope of the invention. In some embodiments of the invention, the sheet-to-sheet space 202 is about 10-200 nm, although other spacing distances are within the contemplated scope of the invention. In some embodiments of the invention, the substrate 112 is recessed below a surface of the sacrificial isolation layer 118.

FIGS. 2C and 2D depict cross-sectional views of the comb-NS Region 108 of the semiconductor structure 100 taken along the lines Y1 and X, respectively, of the reference view 106 after a processing operation according to one or more embodiments of the invention. In some embodiments of the invention, portions of the nanosheet stack 110 can be removed to define a sheet-to-sheet space 204, in a similar manner as described with respect to the a sheet-to-sheet space 202, except that the width of the a sheet-to-sheet space 204 is less than the width of the a sheet-to-sheet space 202. In some embodiments of the invention, the width of the nanosheet stacks 102 is less than about 50 nm, for example 20 nm, although other widths are within the contemplated scope of the invention. In some embodiments of the invention, the sheet-to-sheet space 204 is 10, 20, 30, 40, 50, 60, 70, 80, 90, or 95 percent the width of the sheet-to-sheet space 202, for example, 5-50 nm, although other spacing distances are within the contemplated scope of the invention.

FIGS. 3A and 3B depict cross-sectional views of the GAA NS Region 104 of the semiconductor structure 100 taken along the lines Y1 and X, respectively, of the reference view 102 after a processing operation according to one or more embodiments of the invention. In some embodiments of the invention, an STI liner 302 is formed over the nanosheet stack 110 and the recessed surface of the substrate 112. In some embodiments of the invention, the STI liner 302 is conformally deposited over the GAA NS Region 104. In some embodiments of the invention, the STI liner 302 has a thickness of about 10 nm to about 60 nm, although other thicknesses are within the contemplated scope of the invention.

In some embodiments of the invention, the STI liner 302 is formed using chemical vapor deposition (CVD), plasma-enhanced CVD (PECVD), ultrahigh vacuum chemical vapor deposition (UHVCVD), rapid thermal chemical vapor deposition (RTCVD), metalorganic chemical vapor deposition (MOCVD), low-pressure chemical vapor deposition (LPCVD), limited reaction processing CVD (LRPCVD), atomic layer deposition (ALD), physical vapor deposition (PVD), chemical solution deposition, molecular beam epitaxy (MBE), or other like process in combination with a wet or dry etch process. The STI liner 302 can be made of any suitable dielectric material, such as, for example, silicon oxide, silicon nitride, silicon carbide, hydrogenated silicon carbonitrides (SiC(N, H)), silicon oxynitrides (SiC(N, O, H)), and silicon borocarbonitrides (SiBCN), although other dielectrics are within the contemplated scope of the invention.

FIGS. 3C and 3D depict cross-sectional views of the comb-NS Region 108 of the semiconductor structure 100 taken along the lines Y1 and X, respectively, of the reference view 106 after a processing operation according to one or more embodiments of the invention. In some embodiments of the invention, the STI liner 302 can be formed in a similar manner as discussed with respect to the GAA NS Region 104, except that the smaller width of the sheet-to-sheet space 204 results in a pinch-off that completely fills the sheet-to-sheet space 204. Observe that, for pinch-off to occur, the width of the sheet-to-sheet space 204 will be less than roughly (i.e., within 5%) twice the thickness of the STI liner 302.

FIGS. 4A and 4B depict cross-sectional views of the GAA NS Region 104 of the semiconductor structure 100 taken along the lines Y1 and X, respectively, of the reference view 102 after a processing operation according to one or more embodiments of the invention. In some embodiments of the invention, an STI region 402 is formed over the STI liner 302. The STI region 402 can be made of any suitable dielectric material, such as, for example, silicon oxide, silicon nitride, silicon carbide, hydrogenated silicon carbonitrides, silicon oxynitrides, and silicon borocarbonitrides, although other dielectrics are within the contemplated scope of the invention. In some embodiments of the invention, the STI liner 302 and the STI region 402 can be recessed below a top surface of the sacrificial isolation layer 118 (e.g., to a surface of the substrate 112).

FIGS. 4C and 4D depict cross-sectional views of the comb-NS Region 108 of the semiconductor structure 100 taken along the lines Y1 and X, respectively, of the reference view 106 after a processing operation according to one or more embodiments of the invention. In some embodiments of the invention, the STI region 402 can be formed and the STI region 402 and the STI liner 302 can be recessed in a similar manner as discussed with respect to the GAA NS Region 104, except that remaining portions of the STI liner 302 post-recess define a dielectric pillar 404 (i.e., the pinch-off discussed previously).

FIGS. 5A, 5B, and 5C depict cross-sectional views of the GAA NS Region 104 of the semiconductor structure 100 taken along the lines Y1, Y2, and X, respectively, of the reference view 102 after a processing operation according to one or more embodiments of the invention. In some embodiments of the invention, a sacrificial gate 502 (sometimes referred to as a dummy gate) is formed over the nanosheet stack 110. The portion of a nanosheet stack over which a gate is formed is referred to as a channel region. The sacrificial gate 502 can be made of any suitable material, such as, for example, amorphous silicon or polysilicon. Any known method for patterning a sacrificial gate can be used, such as, for example, a wet etch, a dry etch, or a combination of sequential wet and/or dry etches.

In some embodiments of the invention, a liner 504 (e.g., oxide liner) is formed between the sacrificial gate 502 and the nanosheet stack 110. In some embodiments of the invention, the liner 504 is conformally deposited to a thickness of 1 to 10 nm, although other thicknesses are within the contemplated scope of the disclosure. In some embodiments of the invention, the sacrificial gate 502 and the liner 504 are patterned (i.e., portions are removed) to expose surfaces of the nanosheet stack 110.

As further shown in FIGS. 5A, 5B, and 5C, the sacrificial isolation layer 118 is removed. The sacrificial isolation layer 118 can be removed using a wet etch, a dry etch, or a combination of sequential wet and/or dry etches. In some embodiments of the invention, the sacrificial isolation layer 118 is removed selective to the sacrificial layers 116 and/or the semiconductor layers 114.

FIGS. 5D, 5E, and 5F depict cross-sectional views of the comb-NS Region 108 of the semiconductor structure 100 taken along the lines Y1, Y2, and X, respectively, of the reference view 106 after a processing operation according to one or more embodiments of the invention. In some embodiments of the invention, the sacrificial gate 502 and the liner 504 can be formed and patterned in a similar manner as discussed with respect to the GAA NS Region 104, except that portions of the sacrificial gate 502 are formed over the dielectric pillar 404. Likewise, the sacrificial isolation layer 118 can be removed in a similar manner as discussed with respect to the GAA NS Region 104.

FIGS. 6A, 6B, and 6C depict cross-sectional views of the GAA NS Region 104 of the semiconductor structure 100 taken along the lines Y1, Y2, and X, respectively, of the reference view 102 after a processing operation according to one or more embodiments of the invention. In some embodiments of the invention, a dielectric structure 602 is formed over the GAA NS Region 104. Portions of the dielectric structure 602 replace the previously removed sacrificial isolation layer 118. In some embodiments of the invention, the dielectric structure 602 is conformally deposited over the GAA NS Region 104. The dielectric structure 602 can be made of any suitable dielectric material, such as, for example, silicon oxide, silicon nitride, silicon carbide, hydrogenated silicon carbonitrides, silicon oxynitrides, and silicon borocarbonitrides, although other dielectrics are within the contemplated scope of the invention. As discussed in further detail herein, portions of the dielectric structure 602 will ultimately serve as a bottom isolation, while other portions could serve as a gate spacer (alternatively, the gate spacer can be formed via a separate deposition process and anisotropic etch).

FIGS. 6D, 6E, and 6F depict cross-sectional views of the comb-NS Region 108 of the semiconductor structure 100 taken along the lines Y1, Y2, and X, respectively, of the reference view 106 after a processing operation according to one or more embodiments of the invention. As shown in the cross-sectional view Y2, the dielectric structure 602 can be formed over the GAA NS Region 104 in a similar manner as discussed with respect to the GAA NS Region 104.

FIGS. 7A, 7B, and 7C depict cross-sectional views of the GAA NS Region 104 of the semiconductor structure 100 taken along the lines Y1, Y2, and X, respectively, of the reference view 102 after a processing operation according to one or more embodiments of the invention. In some embodiments of the invention, a bottom isolation 702 and a gate spacer 704 are defined by removing portions of the dielectric structure 602. In some embodiments of the invention, remaining portions of the dielectric structure 602 between the nanosheet stack 110 and the substrate 112 define the bottom isolation 702. As shown in the cross-sectional view X, remaining portions of the dielectric structure 602 adjacent to the sacrificial gate 502 define the gate spacer 704. Observe that the bottom isolation 702 and the gate spacer 704 are formed concurrently as a consequence of the formation of the dielectric structure 602.

As further shown in FIGS. 7A, 7B, and 7C, portions of the nanosheet stack 110 can be removed (sometimes referred to as a stack recess or fin recess) to expose a surface of the bottom isolation 702. The nanosheet stack 110 can be patterned using, for example, a wet etch, a dry etch, or a combination of wet and/or dry etches. In some embodiments of the invention, the nanosheet stack 110 is patterned using a RIE. In some embodiments of the invention, the nanosheet stack 110 is patterned selective to the gate spacer 704.

As shown in the cross-sectional view X, the sacrificial layers 116 can be recessed and inner spacers 706 can be formed on the recessed sidewalls of the sacrificial layers 116. For example, sidewalls of the sacrificial layers 116 can be recessed to form cavities (not shown) in the nanosheet stack 110. In some embodiments of the invention, the inner spacers 706 are formed on recessed sidewalls of the sacrificial layers 116 by filling these cavities with dielectric material. In some embodiments of the invention, portions of the inner spacers 706 that extend beyond sidewalls of the nanosheet stack 110 are removed, using, for example, an isotropic etching process. In this manner, sidewalls of the inner spacers 706 are coplanar to sidewalls of the semiconductor layers 114. In some embodiments of the invention, the inner spacers 706 are formed using a CVD, PECVD, ALD, PVD, chemical solution deposition, or other like processes in combination with a wet or dry etch process. The inner spacers 706 can be made of any suitable material, such as, for example, a low-k dielectric, a nitride, silicon nitride, silicon dioxide, SiON, SiC, SiOCN, or SiBCN.

FIGS. 7D, 7E, and 7F depict cross-sectional views of the comb-NS Region 108 of the semiconductor structure 100 taken along the lines Y1, Y2, and X, respectively, of the reference view 106 after a processing operation according to one or more embodiments of the invention. As shown in FIGS. 7D, 7E, and 7F, the bottom isolation 702 and the gate spacer 704 can be defined by removing portions of the dielectric structure 602. Alternatively, the gate spacer 704 can be formed separately by an additional deposition (not separately shown) followed by anisotropic etch. As further shown in FIGS. 7D, 7E, and 7F, portions of the nanosheet stack 110 can be removed and inner spacers 706 can be formed in a similar manner as discussed with respect to the GAA NS Region 104.

FIGS. 8A, 8B, and 8C depict cross-sectional views of the GAA NS Region 104 of the semiconductor structure 100 taken along the lines Y1, Y2, and X, respectively, of the reference view 102 after a processing operation according to one or more embodiments of the invention. As shown in the cross-sectional views Y2 and X, source and drain regions 802, 804 are formed on exposed sidewalls of the semiconductor layers 114.

The source and drain regions 802, 804 can be epitaxially grown using, for example, vapor-phase epitaxy (VPE), molecular beam epitaxy (MBE), liquid-phase epitaxy (LPE), or other suitable processes. The source and drain regions 802, 804 can be semiconductor materials epitaxially grown from gaseous or liquid precursors. In some embodiments of the invention, the gas source for the epitaxial deposition of semiconductor material includes a silicon containing gas source, a germanium containing gas source, or a combination thereof. For example, a silicon layer can be epitaxially deposited (or grown) from a silicon gas source that is selected from the group consisting of silane, disilane, trisilane, tetrasilane, hexachlorodisilane, tetrachlorosilane, dichlorosilane, trichlorosilane, methylsilane, dimethylsilane, ethylsilane, methyldisilane, dimethyldisilane, hexamethyldisilane and combinations thereof. A germanium layer can be epitaxially deposited from a germanium gas source that is selected from the group consisting of germane, digermane, halogermane, dichlorogermane, trichlorogermane, tetrachlorogermane and combinations thereof. A silicon germanium alloy layer can be epitaxially formed utilizing a combination of such gas sources. Carrier gases like hydrogen, nitrogen, helium and argon can be used. In some embodiments of the invention, the epitaxial semiconductor materials include carbon doped silicon (Si:C). This Si:C layer can be grown in the same chamber used for other epitaxy steps or in a dedicated Si:C epitaxy chamber. The Si:C can include carbon in the range of about 0.2 percent to about 3.0 percent.

Epitaxially grown silicon and silicon germanium can be doped by adding n-type dopants (e.g., P or As) or p-type dopants (e.g., Ga, B, $BF_2$, or Al) as desired. In some embodiments of the invention, the source and drain regions 802 are n-type source and drain regions while the source and drain regions 804 are p-type source and drain regions (or vice versa). In some embodiments of the invention, the source and drain regions 802, 804 can be epitaxially formed and doped by a variety of methods, such as, for example, in-situ doped epitaxy (doped during deposition), doped following the epitaxy, or by implantation and plasma doping. The dopant concentration in the doped regions can range from $1\times10^{19}$ cm$^{-3}$ to $2\times10^{21}$ cm$^{-3}$, or between $1\times10^{20}$ cm$^{-3}$ and $1\times10^{21}$ cm$^{-3}$.

As further shown in the cross-sectional views Y2 and X, an interlayer dielectric (ILD) 806 is formed over the source and drain regions 802, 804. The ILD 806 can be made of any suitable dielectric material, such as, for example, oxides, a low-k dielectric, nitrides, silicon nitride, silicon oxide, SiON, SiC, SiOCN, and SiBCN. In some embodiments of the invention, the ILD 806 is deposited over the semiconductor structure 100 and the semiconductor structure 100 is then planarized using, for example, CMP.

As shown in the cross-sectional views Y1 and X, the sacrificial gate 502, the liner 504, and the sacrificial layers 116 can be removed to release the semiconductor layers 114 (once released, the semiconductor layers 114 are often referred to as nanosheets or channels). The sacrificial gate 502, the liner 504, and/or the sacrificial layers 116 can be removed selective to the semiconductor layers 114. For example, when the semiconductor layers 114 are formed of silicon and the sacrificial layers 116 are formed of silicon germanium, hydrogen chloride (HCl) gas, or an aqueous solution containing a mix of ammonia and hydrogen peroxide can be utilized to remove silicon germanium selective to silicon. In another example, when the semiconductor layers 114 are formed of silicon germanium and the sacrificial layers 116 are formed of silicon, aqueous hydroxide chemistry, including ammonium hydroxide and potassium hydroxide, can be utilized to remove silicon selective to silicon germanium.

FIGS. 8D, 8E, and 8F depict cross-sectional views of the comb-NS Region 108 of the semiconductor structure 100 taken along the lines Y1, Y2, and X, respectively, of the reference view 106 after a processing operation according to one or more embodiments of the invention. As shown in FIGS. 8D, 8E, and 8F, the source and drain regions 802, 804 and the ILD 806 can be formed and the semiconductor layers 114 can be released in a similar manner as discussed with respect to the GAA NS Region 104, except that the source and drain regions 802, 804 extend to sidewalls of the dielectric pillar 404 in the comb-NS Region 108.

FIGS. 9A, 9B, and 9C depict cross-sectional views of the GAA NS Region 104 of the semiconductor structure 100 taken along the lines Y1, Y2, and X, respectively, of the reference view 102 after a processing operation according to one or more embodiments of the invention. As shown in the cross-sectional views Y1 and X, the removed sacrificial gate 502 (FIG. 7A) can be replaced with a conductive gate 902.

The conductive gate 902 can be a high-k metal gate (HKMG) formed over channel regions of the nanosheet stack 110 using, for example, known replacement metal gate (RMG) processes, or so-called gate-last processes. As used herein, the "channel region" refers to the portion of the semiconductor layers 114 over which the conductive gate 902 is formed, and through which current passes from source to drain in the final device. In some embodiments of the invention, the conductive gate 902 can include a gate dielectric and a work function metal stack (not separately depicted).

In some embodiments of the invention, the gate dielectric is a high-k dielectric film formed on a surface (sidewall) of the semiconductor layers 114. The high-k dielectric film can be made of, for example, silicon oxide, silicon nitride, silicon oxynitride, boron nitride, high-k materials, or any combination of these materials. Examples of high-k materials include but are not limited to metal oxides such as hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The high-k materials can further include dopants such as lanthanum and aluminum. In some embodiments of the invention, the high-k dielectric film can have a thickness of about 0.5 nm to about 4 nm. In some embodiments of the invention, the high-k dielectric film includes hafnium oxide and has a thickness of about 1 nm, although other thicknesses are within the contemplated scope of the invention.

The work function metal stack, if present, can include one or more work function layers positioned between the high-k dielectric film and a bulk gate material. In some embodiments of the invention, the conductive gate 902 includes one or more work function layers, but does not include a bulk gate material. The work function layers can be made of, for example, aluminum, lanthanum oxide, magnesium oxide, strontium titanate, strontium oxide, titanium nitride, tantalum nitride, hafnium nitride, tungsten nitride, molybdenum nitride, niobium nitride, hafnium silicon nitride, titanium aluminum nitride, tantalum silicon nitride, titanium aluminum carbide, tantalum carbide, and combinations thereof. The work function layers can serve to modify the work function of the conductive gate 902 and enables tuning of the device threshold voltage. The work function layers can be formed to a thickness of about 0.5 to 6 nm, although other thicknesses are within the contemplated scope of the invention. In some embodiments of the invention, each of the work function layers can be formed to a different thickness.

In some embodiments, the conductive gate 902 includes a main body formed from bulk conductive gate material(s) deposited over the work function layers and/or gate dielectrics. The bulk gate material can include any suitable conducting material, such as, for example, metal (e.g., tungsten, titanium, tantalum, ruthenium, zirconium, cobalt, copper, aluminum, lead, platinum, tin, silver, gold), conducting metallic compound material (e.g., tantalum nitride, titanium nitride, tantalum carbide, titanium carbide, titanium aluminum carbide, tungsten silicide, tungsten nitride, ruthenium oxide, cobalt silicide, nickel silicide), conductive carbon, graphene, or any suitable combination of these materials. The conductive gate material can further include dopants that are incorporated during or after deposition.

In some embodiments of the invention, a dielectric cap 904 is formed over the conductive gate 902. The dielectric cap 904 can be made of any suitable dielectric material, such as, for example, SiN. The dielectric cap 904 is often referred to as a self-aligned cap (SAC cap), as the dielectric cap 904 is confined between sidewalls of the gate spacer 704 (FIG. 9C).

As shown in the cross-sectional views Y2 and X, portions of the ILD 806 can be removed (patterned) to form contact trenches (not separately shown) which can be filled with conductive material. In some embodiments of the invention, the source/drain contact trenches expose surfaces of the source and drain regions 802, 804, as well as the conductive gate 902. The ILD 806 can be patterned using a wet etch, a dry etch, or a combination of sequential wet and/or dry etches.

In some embodiments of the invention, source/drain contacts 906, 908 can be formed in or deposited into the contact trenches to make electrical contact with the source and drain regions 802, 804, respectively. Similarly, source/drain contacts (not separately shown) can be formed in or deposited into contact trenches to make electrical contact with the conductive gate 902.

The source/drain contacts 906, 908 can be formed from conductive materials that include copper or a non-copper metal (e.g., tungsten, titanium, tantalum, ruthenium, zirconium, cobalt, aluminum, platinum), alloys thereof, conducting metallic compound material (e.g., tantalum nitride, titanium nitride, tantalum carbide, titanium carbide, titanium aluminum carbide, tungsten silicide, tungsten nitride, cobalt silicide, nickel silicide), conductive carbon, or any suitable combination of these materials. In some embodiments of the invention, the source/drain contacts 906, 908 are formed of a same conductive material, for example, cobalt, copper, ruthenium, or tungsten. In some embodiments of the invention, the source/drain contacts 906, 908 are made of different conductive materials. In some embodiments of the invention, the source/drain contacts 906, 908 each include a barrier liner (sometimes referred to as a metal liner, or barrier metal liner) to prevent diffusion into surrounding dielectrics (not shown).

FIGS. 9D, 9E, and 9F depict cross-sectional views of the comb-NS Region 108 of the semiconductor structure 100 taken along the lines Y1, Y2, and X, respectively, of the reference view 106 after a processing operation according to one or more embodiments of the invention. As shown in FIGS. 9D, 9E, and 9F, the conductive gate 902, dielectric cap 904, and source/drain contacts 906, 908 can be formed in a similar manner as discussed with respect to the GAA NS Region 104.

FIGS. 10A, 10B, and 10C depict cross-sectional views of semiconductor structures 1002, 1004, and 1006, respectively, after a set of fabrication operations have been applied as part of a method of fabricating a final semiconductor device according to one or more embodiments of the invention. The semiconductor structure 1002 depicts an embodiment having an N-P configuration (i.e., in a similar manner as the semiconductor structure 100 shown in FIGS. 1-9F). Conversely, the semiconductor structure 1004 depicts an alternative embodiment having a P-P configuration, and the semiconductor structure 1006 depicts an alternative embodiment having an N-N configuration. As shown in FIGS. 10A, 10B, and 10C, the dielectric pillar 404 can be preserved for N-P configurations (as shown in FIG. 10A) and recessed in source/drain regions for P-P and N-N configurations (as shown in FIGS. 10B and 10C, respectively). Observe that controlling the height of the dielectric pillar 404 affords flexibility with regards to N/P configurations without sacrificing area (no additional area penalty).

Figure 11:
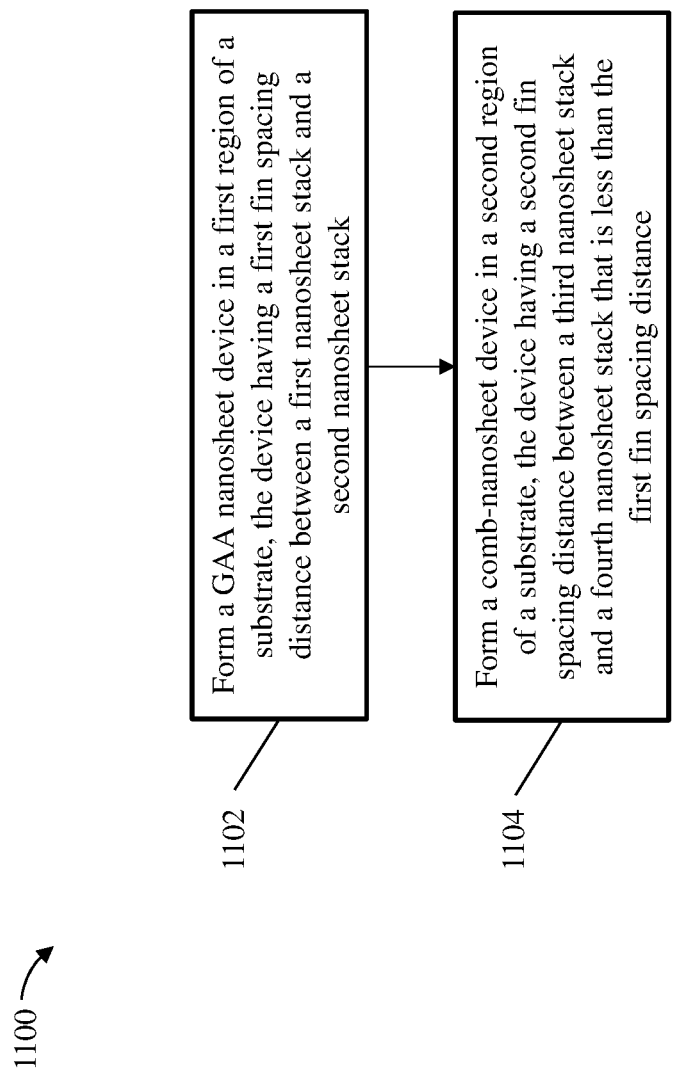
FIG. 11 depicts a flow diagram illustrating a method according to one or more embodiments of the invention.

FIG. 11 depicts a flow diagram illustrating a method 1100 for co-integrating GAA nanosheets and comb-nanosheets on the same chip, wafer, or substrate according to one or more embodiments of the invention. As shown at block 1102, a GAA nanosheet device is formed in a first region of a substrate. The GAA nanosheet device includes a first nanosheet stack, a second nanosheet stack, and a first fin spacing distance between the first nanosheet stack and the second nanosheet stack. In some embodiments of the invention, the first nanosheet stack is an NFET stack and the second nanosheet stack is a PFET stack. In other embodiments, the first nanosheet stack and the second nanosheet stack are both NFET (or PFET) stacks.

At block 1104, a comb-nanosheet device is formed in a second region of a substrate. The comb-nanosheet device includes a third nanosheet stack, a fourth nanosheet stack, and a second fin spacing distance between the third nanosheet stack and the fourth nanosheet stack. The second fin spacing distance is less than the first fin spacing distance. In some embodiments of the invention, the third nanosheet stack is an NFET stack and the fourth nanosheet stack is a PFET stack. In other embodiments, the third nanosheet stack and the fourth nanosheet stack are both NFET (or PFET) stacks.

In some embodiments of the invention, a same number of nanosheets are formed in the GAA nanosheet device and the comb-nanosheet device (i.e., the number of nanosheets in the first, second, third, and fourth nanosheet stacks is the same). In some embodiments of the invention, a same stack height is formed in the GAA nanosheet device and the comb-nanosheet device (i.e., the topmost nanosheet in the first, second, third, and fourth nanosheet stacks are at the same height).

In some embodiments of the invention, forming the comb-nanosheet device includes forming an STI liner and a dielectric pillar. In some embodiments of the invention, the STI liner and the dielectric pillar comprise portions of a monolithic structure.

In some embodiments of the invention, forming the comb-nanosheet device further includes forming a first source or drain region having a first doping type and forming a second source or drain region having a second doping type opposite the first doping type. In some embodiments of the invention, the first source or drain region is isolated from the second source or drain region by the dielectric pillar.

In some embodiments of the invention, forming the comb-nanosheet device further includes forming a first source or drain region having a first doping type and forming a second source or drain region having the first doping type. In some embodiments of the invention, the dielectric pillar is recessed such that the first source or drain region and the second source or drain region merge.

In some embodiments of the invention, the GAA nanosheet device and the comb-nanosheet device each comprise a gate spacer and a bottom isolation. In some embodiments of the invention, the gate spacer and the bottom isolation comprise portions of a monolithic structure. In some embodiments of the invention, the bottom isolation is positioned between a portion of a gate and the substrate in a gate region and between a source or drain region and the substrate in a source/drain region.

The methods and resulting structures described herein can be used in the fabrication of IC chips. The resulting IC chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes IC chips, ranging from toys and other low-end applications to advanced computer products having a display, a keyboard or other input device, and a central processor.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Similarly, the term "coupled" and variations thereof describes having a communications path between two elements and does not imply a direct connection between the elements with no intervening elements/ connections between them. All of these variations are considered a part of the specification. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

Spatially relative terms, e.g., "beneath," "below," "lower," "above," "upper," and the like, are used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the term "below" can encompass both an orientation of above and below. The device can be otherwise oriented (e.g., rotated 90 degrees or at other orientations), and the spatially relative descriptors used herein should be interpreted accordingly.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

The phrase "selective to," such as, for example, "a first element selective to a second element," means that the first element can be etched and the second element can act as an etch stop.

The term "conformal" (e.g., a conformal layer or a conformal deposition) means that the thickness of the layer is substantially the same on all surfaces, or that the thickness variation is less than 15% of the nominal thickness of the layer.

The terms "epitaxial growth and/or deposition" and "epitaxially formed and/or grown" mean the growth of a semiconductor material (crystalline material) on a deposition surface of another semiconductor material (crystalline material), in which the semiconductor material being grown (crystalline overlayer) has substantially the same crystalline characteristics as the semiconductor material of the deposition surface (seed material). In an epitaxial deposition process, the chemical reactants provided by the source gases can be controlled and the system parameters can be set so that the depositing atoms arrive at the deposition surface of the semiconductor substrate with sufficient energy to move about on the surface such that the depositing atoms orient themselves to the crystal arrangement of the atoms of the deposition surface. An epitaxially grown semiconductor material can have substantially the same crystalline characteristics as the deposition surface on which the epitaxially grown material is formed. For example, an epitaxially grown semiconductor material deposited on a <100> orientated crystalline surface can take on a <100> orientation. In some embodiments of the invention of the invention, epitaxial growth and/or deposition processes can be selective to forming on semiconductor surface, and may or may not deposit material on other exposed surfaces, such as silicon dioxide or silicon nitride surfaces.

As used herein, "p-type" refers to the addition of impurities to an intrinsic semiconductor that creates deficiencies of valence electrons. In a silicon-containing substrate, examples of p-type dopants, i.e., impurities, include but are not limited to, boron, aluminum, gallium, and indium.

As used herein, "n-type" refers to the addition of impurities that contributes free electrons to an intrinsic semiconductor. In a silicon containing substrate examples of n-type dopants, i.e., impurities, include but are not limited to antimony, arsenic and phosphorous.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), chemical-mechanical planarization (CMP), and the like. Reactive ion etching (RIE), for example, is a type of dry etching that uses chemically reactive plasma to remove a material, such as a masked pattern of semiconductor material, by exposing the material to a bombardment of ions that dislodge portions of the material from the exposed surface. The plasma is typically generated under low pressure (vacuum) by an electromagnetic field. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The flowchart and block diagrams in the Figures illustrate possible implementations of fabrication and/or operation methods according to various embodiments of the present invention. Various functions/operations of the method are represented in the flow diagram by blocks. In some alternative implementations, the functions noted in the blocks can occur out of the order noted in the Figures. For example, two blocks shown in succession can, in fact, be executed substantially concurrently, or the blocks can sometimes be executed in the reverse order, depending upon the functionality involved.

The descriptions of the various embodiments of the present invention have been presented for purposes of illustration, but are not intended to be exhaustive or limited to the embodiments described. Many modifications and variations will be apparent to those of ordinary skill in the art without departing from the scope and spirit of the described embodiments. The terminology used herein was

What is claimed is:

1. A method for co-integrating a gate-all-around (GAA) nanosheet device with a comb-nanosheet device, the method comprising:
   forming a GAA nanosheet device in a first region of a substrate, the GAA nanosheet device comprising a first nanosheet stack, a second nanosheet stack, and a first fin spacing distance between the first nanosheet stack and the second nanosheet stack; and
   forming a comb-nanosheet device in a second region of a substrate, the comb-nanosheet device comprising a third nanosheet stack, a fourth nanosheet stack, and a second fin spacing distance between the third nanosheet stack and the fourth nanosheet stack, wherein the second fin spacing distance is less than the first fin spacing distance;
   wherein forming the comb-nanosheet device comprises forming a shallow trench isolation (STI) liner and forming a dielectric pillar, wherein the STI liner and the dielectric pillar comprise portions of a monolithic structure;
   wherein forming the comb-nanosheet device further comprises forming a first source or drain region having a first doping type and forming a second source or drain region having the first doping type; and
   wherein the dielectric pillar is recessed such that the first source or drain region and the second source or drain region merge.

2. The method of claim 1 further comprising forming a same number of nanosheets in the GAA nanosheet device and the comb-nanosheet device.

3. The method of claim 1, wherein the GAA nanosheet device and the comb-nanosheet device each comprise a same nanosheet stack height.

4. The method of claim 1, wherein forming the comb-nanosheet device further comprises forming a first source or drain region having a first doping type and forming a second source or drain region having a second doping type opposite the first doping type.

5. The method of claim 4, wherein the first source or drain region is isolated from the second source or drain region by the dielectric pillar.

6. The method of claim 1, wherein the GAA nanosheet device and the comb-nanosheet device each comprise a gate spacer and a bottom isolation, wherein the gate spacer and the bottom isolation comprise portions of a monolithic structure.

7. The method of claim 6, wherein the bottom isolation is positioned between a portion of a gate and the substrate in a gate region and between a source or drain region and the substrate in a source/drain region.

* * * * *